United States Patent
Suzuki

(10) Patent No.: US 11,164,783 B2
(45) Date of Patent: Nov. 2, 2021

(54) MANUFACTURING METHOD OF SEMICONDUCTOR DEVICE WITH METAL FILM

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/671,463

(22) Filed: Nov. 1, 2019

(65) Prior Publication Data

US 2020/0144120 A1    May 7, 2020

(30) Foreign Application Priority Data

Nov. 6, 2018  (JP) .............................. JP2018-209003

(51) Int. Cl.

| | |
|---|---|
| H01L 21/683 | (2006.01) |
| H01L 21/311 | (2006.01) |
| H01L 21/56 | (2006.01) |
| H01L 21/304 | (2006.01) |
| H01L 21/78 | (2006.01) |

(52) U.S. Cl.
CPC .......... *H01L 21/78* (2013.01); *H01L 21/304* (2013.01); *H01L 21/3043* (2013.01); *H01L 21/6836* (2013.01)

(58) Field of Classification Search
CPC ............ H01L 21/304; H01L 21/31138; H01L 21/6836; H01J 37/32623; H01J 37/32743
See application file for complete search history.

(56) References Cited

U.S. PATENT DOCUMENTS

| | | | | |
|---|---|---|---|---|
| 2001/0034564 A1* | 10/2001 | Jones | .................. | B23K 26/073 700/166 |
| 2003/0129809 A1* | 7/2003 | Takyu | .................... | H01L 21/78 438/460 |
| 2006/0088984 A1* | 4/2006 | Li | ...................... | B23K 26/0624 438/463 |
| 2007/0155131 A1* | 7/2007 | Contes | ................... | H01L 21/78 438/458 |
| 2008/0213978 A1* | 9/2008 | Henry | .................. | B08B 7/0092 438/462 |

(Continued)

FOREIGN PATENT DOCUMENTS

| | | |
|---|---|---|
| JP | 2001044680 A | 2/2001 |
| JP | 2004072051 A | 3/2004 |

*Primary Examiner* — Brian Turner
(74) *Attorney, Agent, or Firm* — Greer Burns & Crain, Ltd.

(57) ABSTRACT

A manufacturing method of a semiconductor device with a metal film includes a cut groove forming step of causing a cutting blade to cut into a first surface of a workpiece and forming cut grooves with a depth that exceeds the finished thickness of the workpiece along planned dividing lines, a protective member sticking step of sticking a protective member to the first surface of the workpiece, a grinding step of grinding the side of a second surface until the thickness of the workpiece becomes the finished thickness to divide the workpiece into semiconductor devices, a metal film covering step of covering, by a metal film, the side surface of each of the semiconductor devices for which the protective member is stuck to the side of the first surface and the side of the second surface after the grinding, and a protective member removing step of removing the protective member.

13 Claims, 18 Drawing Sheets

(56) References Cited

U.S. PATENT DOCUMENTS

| | | | |
|---|---|---|---|
| 2012/0228749 A1* | 9/2012 | Pagaila | H01L 23/147 257/659 |
| 2015/0255349 A1* | 9/2015 | Holden | H01J 37/32009 438/462 |
| 2015/0348936 A1* | 12/2015 | Lin | H01L 21/568 257/659 |
| 2018/0158713 A1* | 6/2018 | Okita | H01L 21/304 |
| 2020/0219734 A1* | 7/2020 | Unezaki | H05K 9/002 |

* cited by examiner

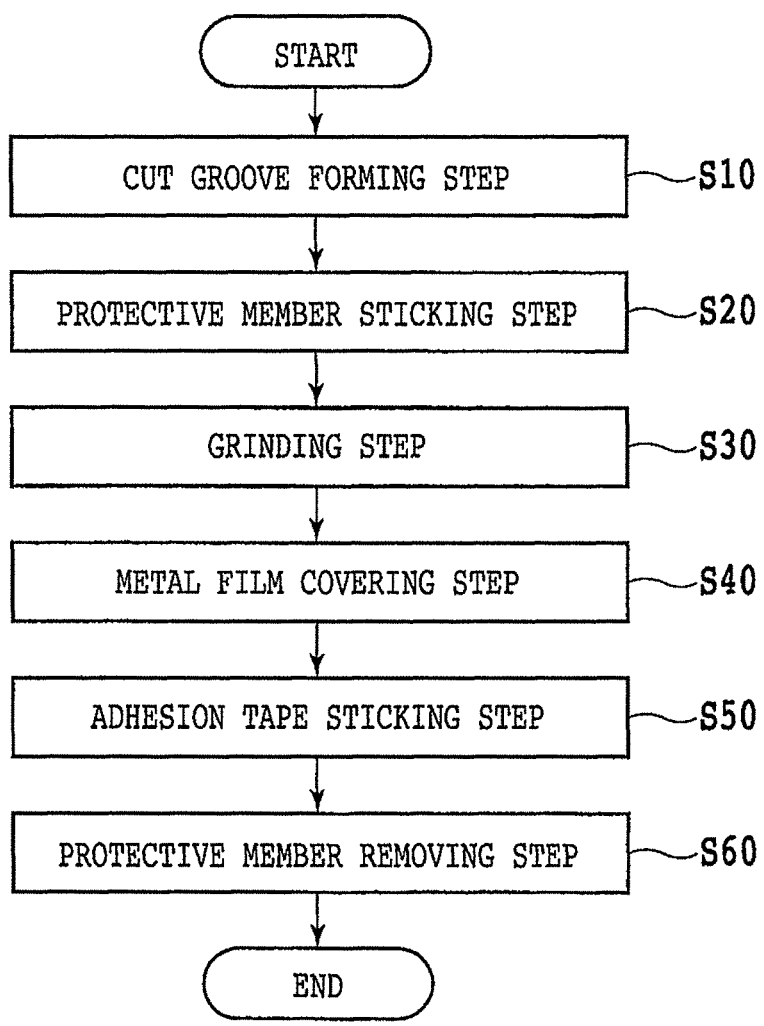

MANUFACTURING METHOD OF SEMICONDUCTOR DEVICE WITH METAL FILM

BACKGROUND OF THE INVENTION

Field of the Invention

The present invention relates to a method for manufacturing a semiconductor device at least part of which is covered by a metal film.

Description of the Related Art

In recent years, in pieces of portable radio communication equipment such as mobile phones and smartphones, the number of electronic parts such as surface acoustic wave (SAW) devices and antenna elements configuring a radio system of the portable radio communication equipment has been increasing for enhancement in functions, enhancement in the performance, and so forth. Furthermore, for enhancement in functions, enhancement in the performance, and so forth of the portable radio communication equipment, further enhancement in the data transfer rate of various semiconductor devices such as dynamic random access memory (DRAM) and flash memory mounted in the portable radio communication equipment is also being promoted. There is a problem that, in association with the enhancement in the data transfer rate, electromagnetic waves generated by various semiconductor devices become noise for the radio system and adversely affect the radio system. In view of this, a technique is known in which a semiconductor device is covered by a metal that functions as an electromagnetic wave shield in order to reduce the influence of the electromagnetic wave noise. For example, the electromagnetic wave noise can be reduced by covering the semiconductor device by a case of a molded article of a thermoplastic resin having a metal (for example, refer to Japanese Patent Laid-open No. 2001-44680) or a lid body of a metal plate and a wall part of an electrically-conductive elastomer (for example, refer to Japanese Patent Laid-open No. 2004-72051).

SUMMARY OF THE INVENTION

However, when the metal case, the lid body of a metal plate, or the like is employed, the space necessary for mounting the electromagnetic wave shield becomes comparatively large and therefore reduction in the size and thickness of the portable radio communication equipment is precluded. The present invention is made in view of such a problem and intends to reduce the space necessary for mounting an electromagnetic wave shield.

In accordance with an aspect of the present invention, there is provided a manufacturing method of a semiconductor device with a metal film. The manufacturing method includes a cut groove forming step of causing a cutting blade to cut into a first surface of a workpiece having the first surface under which an electrode of a semiconductor element is disposed in each of regions marked out by a plurality of planned dividing lines disposed in a lattice manner and a second surface on the opposite side to the first surface, and forming cut grooves with a depth that exceeds a finished thickness of the workpiece along the planned dividing lines, and a protective member sticking step of sticking a protective member to the first surface of the workpiece after the cut groove forming step. The manufacturing method also includes a grinding step of holding the workpiece on a chuck table through the protective member and grinding the side of the second surface until the thickness of the workpiece becomes the finished thickness to divide the workpiece into a plurality of semiconductor devices, a metal film covering step of covering, by a metal film, a side surface of each of the plurality of semiconductor devices for which the protective member is stuck to the side of the first surface and the side of the second surface after the grinding after the grinding step, and a protective member removing step of removing the protective member from the side of the first surface after the metal film covering step.

Preferably, the manufacturing method of a semiconductor device with a metal film further includes a protective film covering step of covering the side of the first surface by a protective film before the cut groove forming step and a protective film removing step of removing the protective film after the protective member removing step, and the protective member is brought into tight contact with the protective film in the protective member sticking step.

Furthermore, preferably, the manufacturing method of a semiconductor device with a metal film further includes a laser-processed groove forming step of irradiating the side of the first surface of the workpiece on which the protective film is formed with a laser beam and forming laser-processed grooves with a larger width than the cut grooves along the planned dividing lines after the protective film covering step and before the cut groove forming step.

Moreover, preferably, the manufacturing method of a semiconductor device with a metal film further includes a protective film removal line forming step of forming protective film removal lines obtained through removal of the protective film with a larger width than both the cut grooves and the laser-processed grooves along the planned dividing lines by irradiating the protective film with a laser beam with a wavelength having absorbability with respect to the protective film along the planned dividing lines after the protective film covering step and before the laser-processed groove forming step.

In addition, preferably, the manufacturing method of a semiconductor device with a metal film further includes a debris removing step of carrying out treatment of the workpiece with an etching gas and removing debris adhering to at least one of the laser-processed grooves and the cut grooves after the laser-processed groove forming step or the cut groove forming step and before the protective member sticking step.

Furthermore, preferably, the manufacturing method of a semiconductor device with a metal film further includes an adhesion tape sticking step of sticking an adhesion tape to the side of the second surface covered by the metal film in the plurality of semiconductor devices after the metal film covering step and before the protective member removing step.

Moreover, preferably, the protective member stuck in the protective member sticking step is an adhesion tape having expandability, and the manufacturing method of a semiconductor device with a metal film further includes an expanding step of expanding the protective member and widening the interval between the individual semiconductor devices after the grinding step and before the metal film covering step.

In the manufacturing method of a semiconductor device with a metal film according to the aspect of the present invention, the side surface of each of the semiconductor devices and the second surface ground to the finished thickness are covered by the metal film. Therefore, the space necessary for mounting the electromagnetic wave shield can be reduced compared with the case of employing a case made of a metal, a lid body of a metal plate, or the like.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 4 is a flowchart of a manufacturing method of a semiconductor device with a metal film according to a first embodiment;

DETAILED DESCRIPTION OF THE PREFERRED EMBODIMENTS

Figure 1:
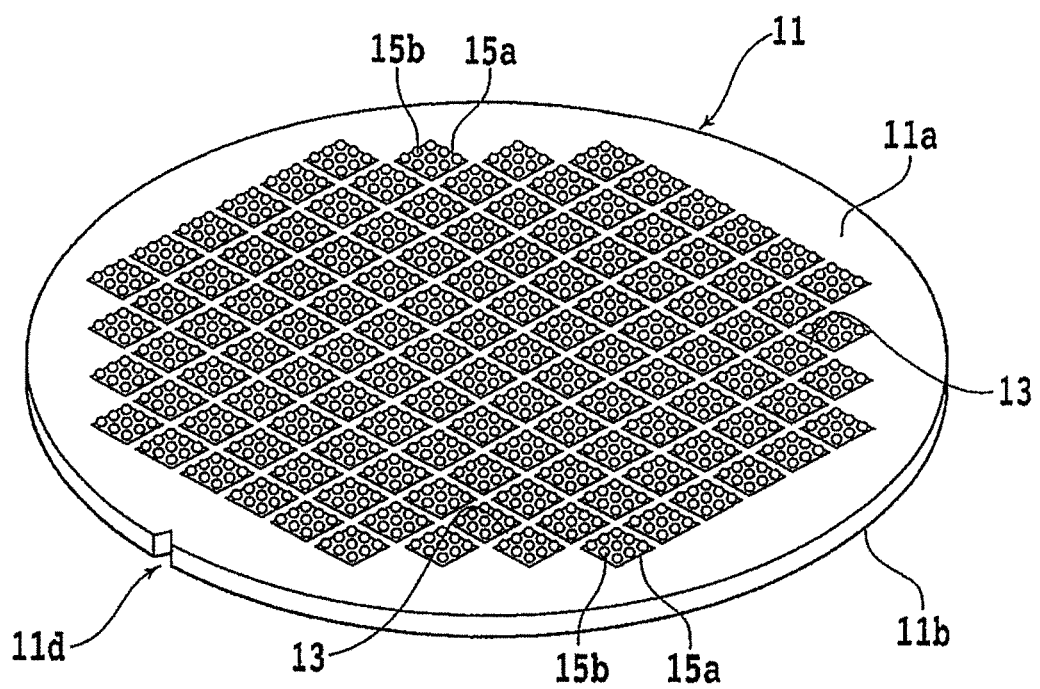
FIG. 1 is a perspective view depicting an example of a workpiece.

Embodiments according to one aspect of the present invention will be described with reference to the accompanying drawings. FIG. 1 is a perspective view depicting an example of a workpiece. The workpiece of the present embodiment is a wafer 11 with a circular disc shape. The wafer 11 has a semiconductor substrate 11c (see FIG. 2A) that is composed mainly of silicon (Si) and is formed into a circular disc shape with a thickness of substantially 500 μm to 1000 μm. There is no limit on the material, shape, structure, size, and so forth of the semiconductor substrate 11c. For example, it is also possible to use a semiconductor material or the like other than silicon composed of gallium arsenide (GaAs), silicon carbide (SiC), or the like as the semiconductor substrate 11c.

Figure 2A:
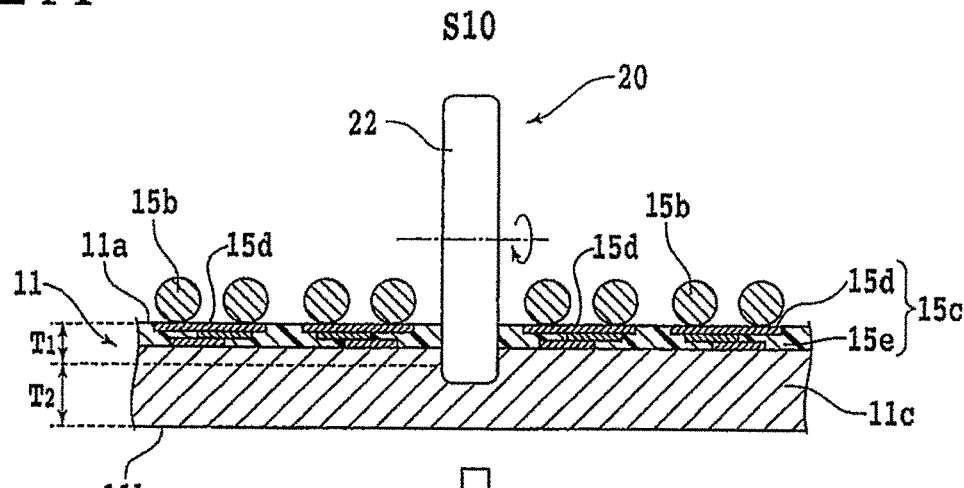
FIG. 2A is a diagram depicting a cut groove forming step (S10)

On the semiconductor substrate 11c, a functional layer 15c that is thinner than the semiconductor substrate 11c and has a circular disc shape is disposed (see FIG. 2A). Semiconductor elements (not depicted) such as integrated circuit (IC) and large scale integration (LSI) are configured by a region in the semiconductor substrate 11c on the side of the functional layer 15c and the functional layer 15c. In the functional layer 15c, electrodes 15d of the semiconductor elements in electrical contact with active regions in the semiconductor substrate 11c configuring the above-described semiconductor elements are disposed. Moreover, the functional layer 15c has a low-dielectric-constant insulator layer (so-called Low-k material layer) 15e that functions as an interlayer insulating layer among the plural electrodes 15d. The upper end of each electrode 15d is exposed from the low-dielectric-constant insulator layer 15e.

Meanwhile, in the present embodiment, the surface of the wafer 11 on the side of the functional layer 15c is referred to as a front surface (first surface) 11a. Furthermore, the surface of the semiconductor substrate 11c on the opposite side to the functional layer 15c is referred to as a back surface (second surface) 11b of the wafer 11. As above, the front surface 11a and the back surface 11b are located on the opposite side to each other across the wafer 11. On the side of the front surface 11a of the wafer 11, a device region 15a including the active region of the semiconductor substrate 11c configuring the above-described semiconductor element and the functional layer 15c is formed in each of regions marked out by plural planned dividing lines (streets) 13 disposed in a lattice manner.

The electrode 15d is exposed in the front surface 11a of the device region 15a and plural bumps (protruding elements) 15b formed into a spherical shape by a metal material such as solder are disposed on this electrode 15d. There is no limit on the kind, quantity, shape, structure, size, arrangement, and so forth of the device regions 15a and the bumps 15b. In the present embodiment, the bumps 15b are disposed on the side of the front surface 11a of the wafer 11. However, the bumps 15b do not have to be disposed. Furthermore, the workpiece may be a so-called wafer level chip size package (WL-CSP) wafer in which the side of the front surface 11a is molded by a sealing resin and the bumps 15b are disposed to protrude from the sealing resin. Moreover, the workpiece may be a resin package substrate in the state in which plural device chips are sealed by a mold resin. The wafer 11 has, on the side of the front surface 11a, a device part in which the plural device regions 15a are disposed and a peripheral surplus part surrounding this device part. A notch 11d that depicts the crystal orientation is made at a peripheral end part of the peripheral surplus part of the wafer 11. An orientation flat or the like may be made instead of the notch 11d.

Next, a manufacturing method of a semiconductor device 21 with a metal film according to a first embodiment will be described by using FIG. 2A to FIG. 2C, FIG. 3A to FIG. 3C, and FIG. 4. In the first embodiment, first, a cut groove is formed in the wafer 11 (cut groove forming step (S10)). FIG. 2A is a diagram depicting the cut groove forming step (S10). In the first embodiment, the cut groove is formed by using a cutting apparatus (not depicted). The cutting apparatus includes a chuck table (not depicted) that sucks and holds the side of the back surface 11b of the wafer 11. The chuck table is joined to a rotation mechanism (not depicted) such as a motor and can rotate around a rotation axis substantially parallel to a Z-axis direction. Furthermore, a table movement mechanism (not depicted) is disposed below the chuck table and the chuck table can move in an X-axis direction (processing feed direction) by this table movement mechanism. X-axis, Y-axis (described later), and Z-axis configure an orthogonal coordinate system. A holding surface of the chuck table is connected to a suction source (not depicted) through a suction path (not depicted) and so forth formed inside the chuck table. By causing a negative pressure of the suction source to act on the holding surface, the side of the back surface 11b of the wafer 11 is sucked and held by the chuck table.

The cutting apparatus further includes a cutting unit (not depicted) for cutting the wafer 11. The cutting unit has a spindle (not depicted) that serves as a rotating shaft substantially parallel to a Y-axis direction (indexing feed direction). The spindle rotates by a rotational drive source (not depicted) such as a motor joined to one end side of the spindle. Furthermore, a blade mount (not depicted) with a circular ring shape is monolithically fixed to the other end side located on the opposite side to the rotational drive source of the spindle in such a form as to be rotatable. A cutting blade 20 with a so-called hub type is mounted to the spindle with the intermediary of the blade mount. The cutting blade 20 of the present embodiment has a base (not depicted) with a circular ring shape and a cutting edge 22 that is disposed at the outer circumference of this base and has a circular ring shape. The cutting edge 22 is formed by mixing abrasive grains of diamond, cubic boron nitride (cBN), or the like into a bond material (binding material) of a metal, resin, or the like, for example.

In the cut groove forming step (S10), first, a dicing tape (not depicted) is stuck to the side of the back surface 11b of the wafer 11 and the side of the back surface 11b of the wafer 11 is placed on the holding surface of the chuck table through this dicing tape. Subsequently, the negative pressure of the suction source is caused to act and the wafer 11 is sucked and held by the chuck table in the state in which the side of the front surface 11a of the wafer 11 is exposed upward. Then, the cutting unit is moved down toward the chuck table while the cutting blade 20 is rotated at high speed, and the cutting blade 20 is made to cut into the side of the front surface 11a of the wafer 11. However, the wafer 11 is not completely cut in the cut groove forming step (S10).

In the cut groove forming step (S10), the cutting-in depth of the cutting blade 20 is adjusted in order to form a cut groove 17 (see FIG. 2B) with a predetermined depth that exceeds a finished thickness $T_1$ of the wafer 11 and does not reach the back surface 11b of the wafer 11. Next, the cutting blade 20 and the chuck table are relatively moved along the X-axis direction while the cutting-in depth of the cutting blade 20 is kept. Thereby, the cut groove 17 is formed in the wafer 11 from one end to the other end of one planned dividing line 13 along the X-axis direction (that is, the wafer 11 is half-cut).

After the cut groove 17 along the one planned dividing line 13 is formed, the cutting unit is moved in the Y-axis direction. Then, the cut groove 17 is similarly formed from one end to the other end of another planned dividing line 13 adjacent to the above-described one planned dividing line 13 in the Y-axis line. After the cut grooves 17 are formed along all planned dividing lines 13 along one direction, the chuck table is rotated by 90 degrees by the rotation mechanism and the cut grooves 17 are similarly formed again along all planned dividing lines 13 along another direction orthogonal to the one direction. Thereby, the cut grooves 17 with the predetermined depth are formed along all planned dividing lines 13 disposed in a lattice manner on the side of the front surface 11a of the wafer 11.

Figure 2B:
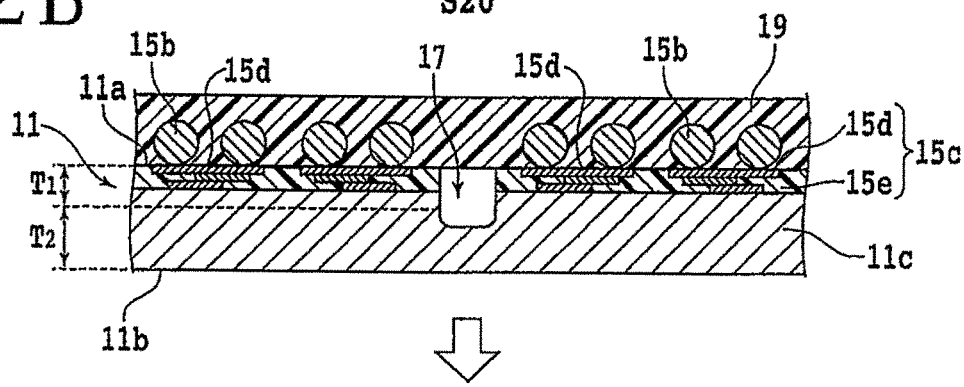
FIG. 2B is a diagram depicting a protective member sticking step (S20)

After the cut groove forming step (S10), a protective member 19 is stuck to the front surface 11a of the wafer 11 (protective member sticking step (S20)). FIG. 2B is a diagram depicting the protective member sticking step (S20). The protective member 19 has a base layer that has substantially the same diameter as the wafer 11 and is made of a resin, for example. For example, the base layer has a thickness of at least 5 μm and at most 200 μm and is formed of a polymer material such as polyolefin (PO), polyvinyl chloride (PVC), polystyrene (PS), or ethylene vinyl acetate (EVA). Furthermore, the protective member 19 has an adhesion layer on the front surface side of the base layer. The adhesion layer is a layer configured by an adhesive made of a resin that is cured and is lowered in the adhesion force when being irradiated with heat or ultraviolet ray, for example. The adhesion layer may be disposed in a ring manner in a circular end-part region of the base layer or may be disposed on the whole surface of the base layer. The adhesion layer does not have to be disposed in the protective member 19. The protective member 19 is bonded to the side of the front surface 11a of the wafer 11 by the adhesion layer in such a form as to be removable. Moreover, the protective member 19 is deformed to follow the concave-convex structure of the bumps 15b and so forth in the device regions 15a of the wafer 11. For example, one surface of the protective member 19 bonds to the front surface 11a of the wafer 11 and the front surfaces of the bumps 15b. If the protective member 19 does not have the adhesion layer, the base layer gets tight contact with the side of the front surface 11a in such a form as to be removable.

In the protective member sticking step (S20), the protective member 19 is stuck to the front surface 11a of the wafer 11 by using a protective member sticking apparatus (not depicted). The protective member sticking apparatus includes a chamber (not depicted) and a suction source (not depicted) for depressurizing the inside of the chamber is connected to this chamber. Furthermore, a support table (not depicted) that supports the wafer 11 is disposed in the chamber. This support table is moved in a predetermined direction (for example, X-axis direction) by a movement mechanism of a ball screw system, for example. The protective member sticking apparatus has a feed mechanism that feeds a tape component (not depicted) wound into a roll shape to the upper side of the support table. The tape component is composed of the protective member 19 and a releasable sheet.

Furthermore, the protective member sticking apparatus has a separating unit (not depicted) that separates the protective member 19 from the releasable sheet when the tape component is fed to the upper side of the support table. The protective member 19 separated from the releasable sheet by the separating unit is fed to the upper side of the support table by the feed mechanism in such a manner that the adhesion layer of the protective member 19 faces the support table. The protective member sticking apparatus further has a pressing roller that presses the base layer side of the protective member 19 fed to the upper side of the support table. Through pressing of the base layer side of the protective member 19 by the pressing roller, the adhesion layer side of the protective member 19 is pressed against the support table.

In the protective member sticking step (S20), first, the side of the back surface 11b of the wafer 11 is placed on the support table. Next, the pressure in the chamber is lowered by the suction source. By depressurizing the inside of the chamber, air, dust, other foreign matters, and so forth can be prevented from entering between the front surface 11a of the wafer 11 and the protective member 19. Then, while the tape component in a roll shape is fed to the upper side of the support table, the releasable sheet is separated from the tape component by the separating unit and the protective member 19 is stuck to the front surface 11a of the wafer 11 disposed on the support table by the pressing roller. By disposing the protective member 19 on the front surface 11a of the wafer 11, damage to the side of the front surface 11a of the wafer 11 in subsequent processing steps can be prevented. It is not essential to use the chamber that is connected to the suction source and is internally depressurized, and the protective member sticking apparatus may stick the protective member 19 to the front surface 11a of the wafer 11 under the atmospheric pressure. In this case, the protective member sticking apparatus is composed of the above-described support table, feed mechanism, separating unit, pressing roller, and so forth.

If the adhesion layer is not made in the protective member 19, in the protective member sticking step (S20), the protective member 19 may be stuck to the wafer 11 while softening and deforming the protective member 19 by heating the support table. The softened protective member 19 is deformed to follow the concave-convex structure of the side of the front surface 11a of the wafer 11 and therefore can get tight contact with the side of the front surface 11a of the wafer 11. The heating temperature may be adjusted as appropriate to become the softening point of each material according to the material of the protective member 19. Furthermore, the protective member 19 may be softened and deformed by blowing a warm wind to the protective member 19 instead of the heating of the support table. In the case of blowing a warm wind, the protective member 19 is pressed against the side of the front surface 11a of the wafer 11 by the wind pressure. Therefore, the protective member 19 can be brought into tight contact with the side of the front surface 11a of the wafer 11 and be stuck thereto without using the pressing roller.

Figure 2C:
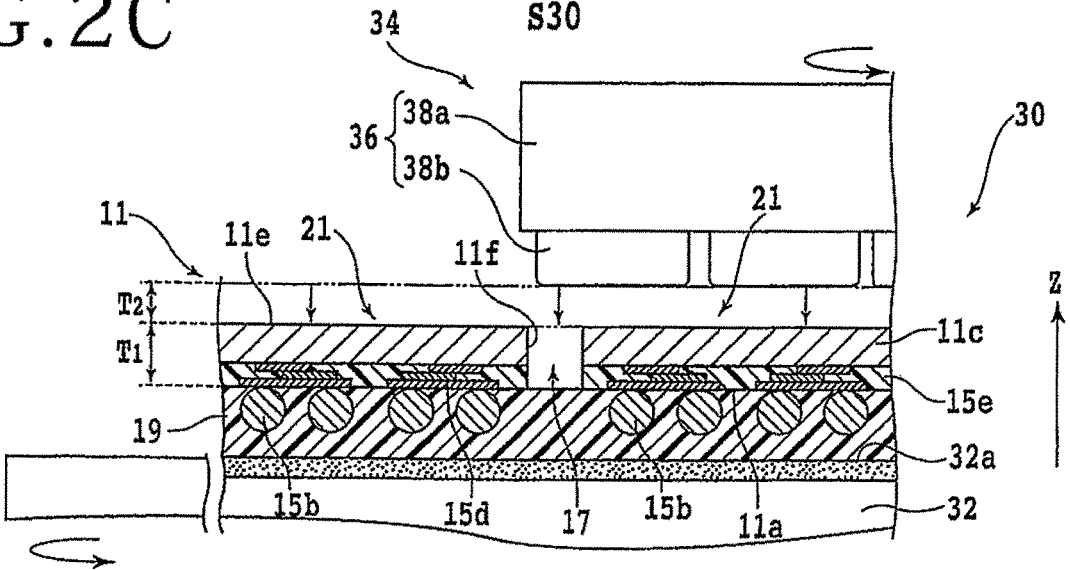
FIG. 2C is a diagram depicting a grinding step (S30)

After the protective member sticking step (S20), the wafer 11 is divided into plural semiconductor devices 21 by grinding the side of the back surface 11b of the wafer 11 until the thickness of the wafer 11 becomes the finished thickness (grinding step (S30)). FIG. 2C is a diagram depicting the grinding step (S30). In the grinding step (S30), the wafer 11 is ground by using a grinding apparatus 30. The grinding apparatus 30 includes a chuck table 32 that sucks and holds the side of the front surface 11a of the wafer 11 through the protective member 19. This chuck table 32 is joined to a rotation mechanism (not depicted) such as a motor and rotates around a rotation axis substantially parallel to the Z-axis direction. A porous member with a circular disc shape is disposed on the front surface side of the chuck table 32 and the front surface of this porous member serves as a holding surface 32a of the chuck table 32. A negative pressure from a suction source (not depicted) acts on the holding surface 32a through a flow path formed inside the chuck table 32 and a suction force to suck the side of the front surface 11a of the wafer 11 is generated for the holding surface 32a.

A grinding mechanism 34 is disposed above the chuck table 32 in such a manner as to be opposed to the holding surface 32a. The grinding mechanism 34 includes a spindle (not depicted) that rotates around a rotation axis substantially parallel to the Z-axis direction. This spindle is raised and lowered along the Z-axis direction by a raising-lowering mechanism (not depicted). A wheel mount (not depicted) with a circular disc shape is fixed to the lower end side of the spindle. A grinding wheel 36 with substantially the same diameter as the wheel mount is mounted on the lower surface of the wheel mount. The grinding wheel 36 includes a ring-shaped wheel base 38a formed of a metal material such as aluminum or stainless steel. Through mounting of the upper surface side of the wheel base 38a on the wheel mount, the wheel base 38a is fixed to the spindle. Furthermore, plural grinding abrasives (abrasive chips) 38b are disposed on the lower surface of the wheel base 38a.

The grinding abrasives 38b each have a substantially parallelepiped rectangular shape and are arranged in a ring manner in such a manner that a gap is made between the grinding abrasives 38b adjacent to each other across the whole circumference of the ring-shaped lower surface of the wheel base 38a. The grinding abrasives 38b are formed by mixing abrasive grains of diamond, cubic boron nitride (cBN), or the like into a binding material of a metal, ceramics, resin, or the like, for example. However, there is no limit on the binding material and the abrasive grains and they are selected as appropriate according to the specification of the grinding abrasives 38b.

In the grinding step (S30) of the present embodiment, first, the wafer 11 on which the protective member 19 is disposed is moved from the protective member sticking apparatus to the chuck table 32 of the grinding apparatus 30. Thereafter, the negative pressure of the suction source (not depicted) is caused to act on the holding surface 32a and the side of the front surface 11a of the wafer 11 is sucked and held by the holding surface 32a through the protective member 19. Then, while the chuck table 32 and the spindle of the grinding mechanism 34 are each rotated in a predetermined direction, the spindle of the grinding mechanism 34 is lowered and the grinding abrasives 38b are pressed against the side of the back surface 11b of the wafer 11. The side of the back surface 11b of the wafer 11 is removed by a thickness $T_2$ and the thickness of the wafer 11 becomes the finished thickness $T_1$. The cut groove 17 is formed to be deeper than the finished thickness $T_1$. Thus, when the wafer 11 is thinned to the finished thickness $T_1$, the semiconductor substrate 11c is divided with the cut groove 17 being the border, so that the wafer 11 is divided into plural semiconductor devices 21.

Figure 3A:
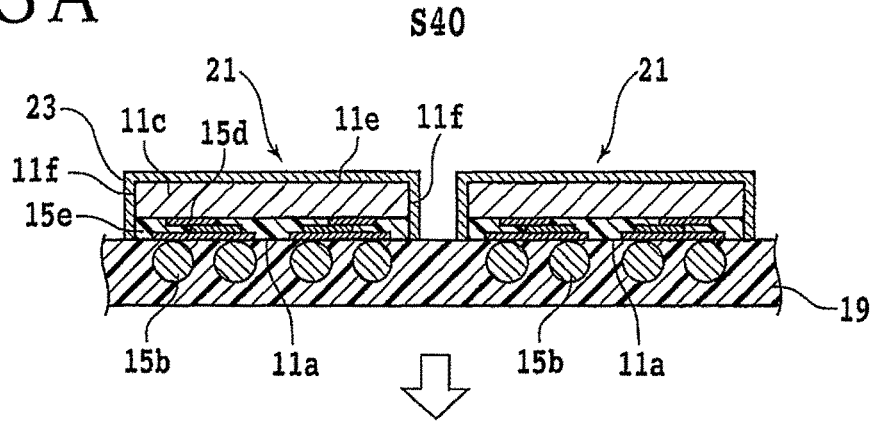
FIG. 3A is a diagram depicting a metal film covering step (S40)

After the grinding step (S30), the side of the back surface of the wafer 11 (i.e. back surfaces 11e of the semiconductor devices 21) after being ground to the finished thickness and a side surface 11f of each of the semiconductor devices 21 (i.e. each side surface of the semiconductor substrate 11c and the functional layer 15c) are covered by a metal film (metal film covering step (S40)). A metal film 23 is a thin film of a metal such as copper (Cu), aluminum (Al), nickel (Ni), or stainless steel. FIG. 3A is a diagram depicting the metal film covering step (S40). In the metal film covering step (S40), the metal film 23 is formed on the wafer 11 by using a physical vapor deposition (PVD) apparatus or a chemical vapor deposition (CVD) apparatus. Vacuum vapor deposition, sputtering, ion plating, or the like is used as the PVD. Furthermore, plasma CVD or the like is used as the CVD.

In the present embodiment, the metal film 23 is formed by using a high-frequency magnetron sputtering apparatus (not depicted, hereinafter abbreviated as sputtering apparatus). The sputtering apparatus includes a treatment chamber (not depicted) and a holding table (not depicted) that holds the wafer 11 by an electrostatic system or another method is disposed inside the treatment chamber. Furthermore, above the holding table, a target (not depicted) that serves as the material of the metal film 23 is disposed in the state of being supported by an excitation member (not depicted). A high-frequency power supply (not depicted) is connected to this target. In addition, an introduction port (not depicted) from which a sputtering gas of argon (Ar) or the like and an exhaust port (not depicted) connected to a depressurization source (not depicted) are made in the treatment chamber.

In the metal film covering step (S40), first, the wafer 11 for which the protective member 19 is stuck to the side of the front surface 11a is placed on the holding table in the treatment chamber through the protective member 19 and the wafer 11 is held by an electrostatic system or another method. That is, the back surfaces 11e of the semiconductor devices 21 after the grinding are made opposed to the target. Next, the treatment chamber is sealed and the inside of the treatment chamber is evacuated from the exhaust port to be depressurized. Next, high-frequency power is applied from the high-frequency power supply to the target magnetized by the excitation member and the sputtering gas is introduced from the introduction port to generate plasma. When ions of the sputtering gas in the plasma impinge on the target, metal particles are sputtered out from the target and the metal is deposited on the back surfaces 11e and the side surfaces 11f of the semiconductor devices 21.

For example, the thickness of the metal film 23 is at least 2 μm and at most 10 μm and preferably at least 3 μm and at most 8 μm. The metal film 23 functions as an electromagnetic wave shield that blocks electromagnetic wave noise emitted from the semiconductor devices 21. As above, in the present embodiment, the metal film 23 on the order of micrometers is formed directly on the back surfaces 11e and the side surfaces 11f of the semiconductor devices 21 as the electromagnetic wave shield. Therefore, the space necessary for mounting the electromagnetic wave shield can be reduced compared with the case of employing a case made of a metal, a lid body of a metal plate, or the like as in the related art. Furthermore, in the metal film covering step (S40), the metal film 23 can be formed for the plural semiconductor devices 21 stuck to the protective member 19 all at once. For this reason, the semiconductor devices 21 can be covered by the electromagnetic wave shield more efficiently compared with the case of covering each semiconductor device individually by a case of a metal or the like as in the related art.

Figure 3B:
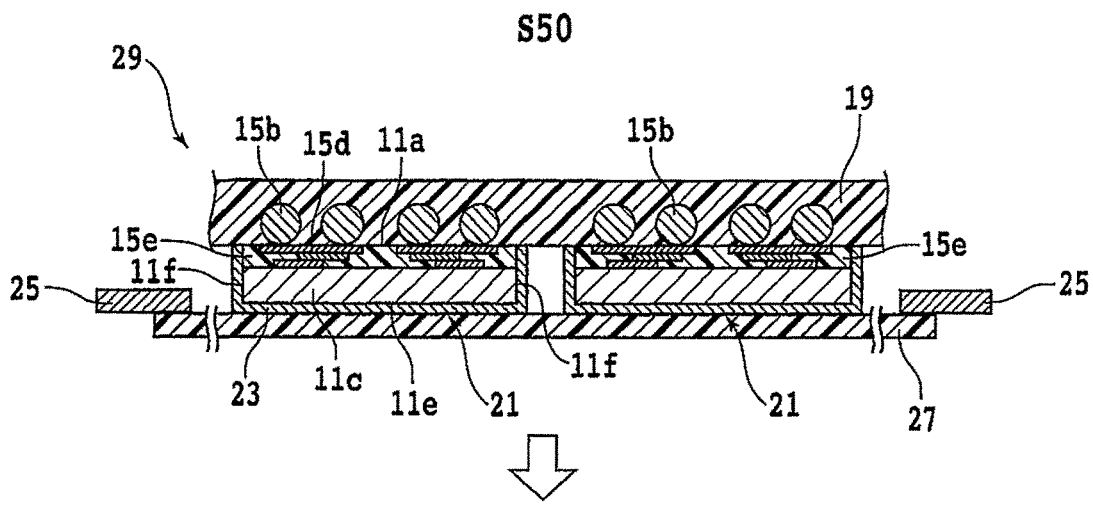
FIG. 3B is a diagram depicting an adhesion tape sticking step (S50)

After the metal film covering step (S40), an adhesion tape 27 is stuck to the plural semiconductor devices 21 and a frame 25 that is made of a metal and has a ring shape to form a frame unit 29 (adhesion tape sticking step (S50)). FIG. 3B is a sectional view of the frame unit 29 in the adhesion tape sticking step (S50). In the adhesion tape sticking step (S50), first, the plural semiconductor devices 21 and the protective member 19 are disposed in the opening of the frame 25 in such a manner that the metal film 23 is located on the upper side. Next, the circular adhesion tape 27 that has a larger diameter than the opening of the frame 25 and is made of a resin is stuck onto the frame 25, the plural semiconductor devices 21, and the protective member 19. Thereby, the adhesion tape 27 is stuck to the side of the back surfaces 11e of the semiconductor devices 21 covered by the metal film 23 and the protective member 19, the plural semiconductor devices 21, and the frame 25 are integrated through the adhesion tape 27 to form the frame unit 29.

Figure 3C:
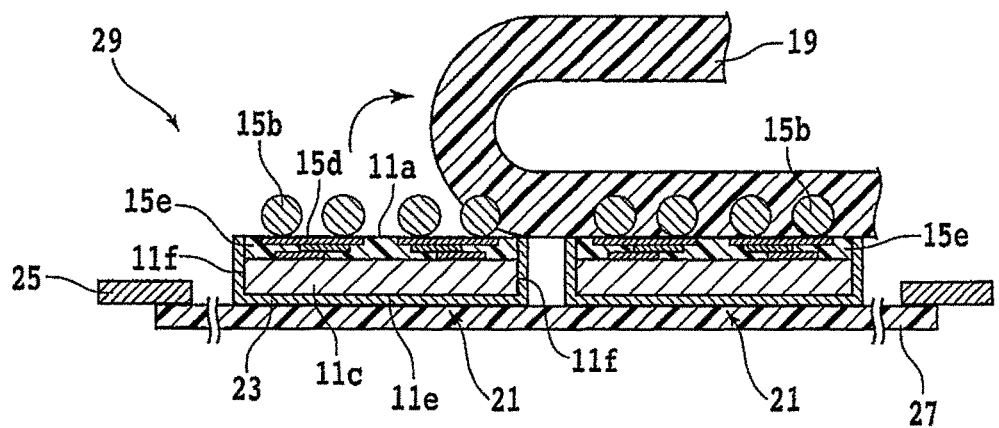
FIG. 3C is a diagram depicting a protective member removing step (S60)

After the adhesion tape sticking step (S50), the protective member 19 is removed from the side of the front surface 11a of the wafer 11 (protective member removing step (S60)). FIG. 3C is a sectional view of the frame unit 29 in the protective member removing step (S60). If the protective member 19 has the adhesion layer, in the protective member removing step (S60), the adhesion force of the adhesion layer of the protective member 19 is lowered by using an ultraviolet irradiation apparatus or a heating apparatus and thereafter the protective member 19 is peeled off from the side of the front surface 11a of the wafer 11. If the protective member 19 does not have the adhesion layer, the protective member 19 can be peeled off from the side of the front surface 11a without treating the protective member 19 by an ultraviolet ray or the like. After the removal of the protective member 19, the individual semiconductor devices 21 are taken out from the adhesion tape 27 by using a pickup apparatus (not depicted) or the like.

FIG. 4 is a flowchart of the manufacturing method of the semiconductor device 21 with the metal film 23 according to the first embodiment. As described above, in the present embodiment, the metal film 23 can be formed directly on the back surfaces 11e and the side surfaces 11f of the semiconductor devices 21 and therefore the space necessary for mounting the electromagnetic wave shield can be reduced. Furthermore, the metal film 23 is formed for all semiconductor devices 21 all at once and therefore the semiconductor devices 21 can be covered by the electromagnetic wave shield more efficiently.

Figure 5A:
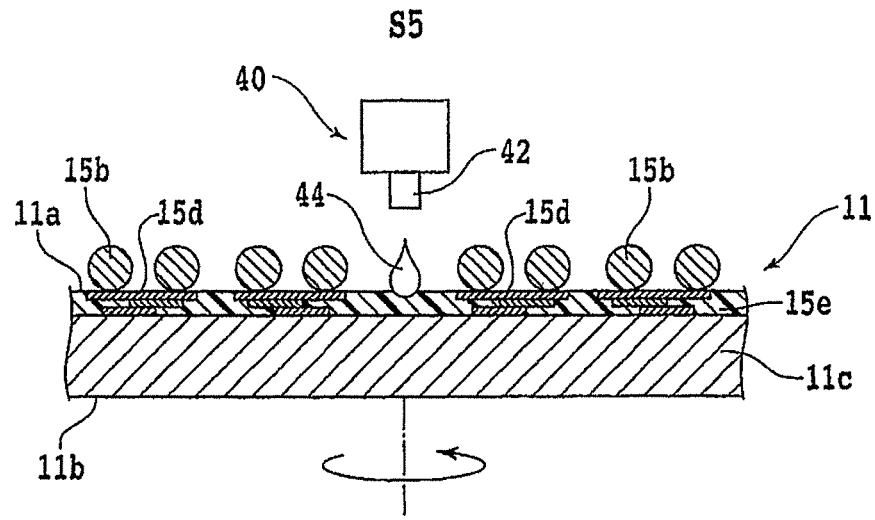
FIG. 5A is a diagram depicting a protective film covering step (S5)
Figure 5B:
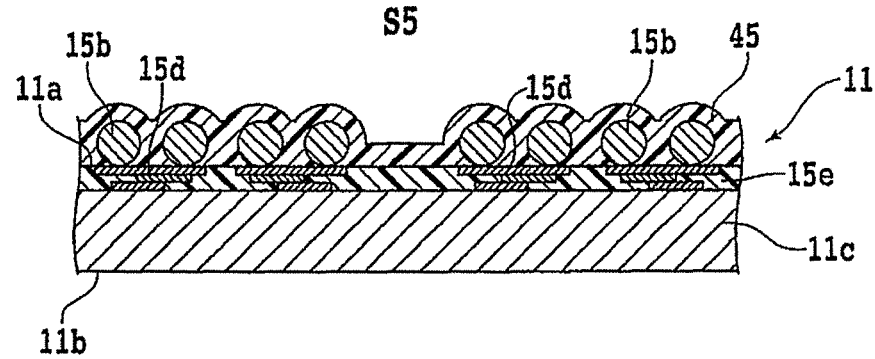
FIG. 5B is a sectional view of a wafer for which a protective film is formed on the front surface side.

Next, a second embodiment will be described by using FIG. 5A to FIG. 8. The second embodiment further includes a protective film covering step (S5) of covering the side of the front surface 11a of the wafer 11 by a protective film before the cut groove forming step (S10). FIG. 5A is a diagram depicting the protective film covering step (S5) and FIG. 5B is a sectional view of the wafer 11 for which a protective film 45 is formed on the side of the front surface 11a. In the protective film covering step (S5), the protective film 45 is formed on the side of the front surface 11a of the wafer 11 by using a protective film forming apparatus 40. The protective film forming apparatus 40 includes a spinner table mechanism (not depicted) and a liquid receiving mechanism (not depicted) disposed to surround the periphery and bottom part of the spinner table mechanism, for example.

The spinner table mechanism includes a circular spinner table (not depicted), a support member (not depicted) that supports the spinner table and has a circular column shape, and an electric motor (not depicted) that rotationally drives the spinner table through the support member. When the electric motor is rotationally driven, the spinner table rotates in an arrow direction in FIG. 5A. The spinner table has a sucking-holding part formed from a porous material and this sucking-holding part is connected to a suction source (not depicted). The wafer 11 placed on the sucking-holding part of the spinner table is sucked and held on the sucking-holding part by a negative pressure from the suction source. The above-described liquid receiving mechanism includes a liquid receiving container (not depicted) that surrounds the periphery and bottom part of the spinner table mechanism and a cover member (not depicted) mounted on the support member.

The protective film forming apparatus 40 further includes a liquid-state resin discharge unit (not depicted) that discharges a resin in a liquid state to the side of the front surface 11a of the wafer 11 held by the spinner table. The liquid-state resin discharge unit has an arm with a substantially L-shape, a liquid-state resin discharge nozzle 42 that is disposed at the tip of this arm and discharges the liquid-state resin, and an electric motor that swings the arm. The liquid-state resin discharge nozzle 42 is connected to a liquid-state resin supply source (not depicted) through the arm. The protective film forming apparatus 40 is used also as a cleaning apparatus that cleans the wafer 11. The protective film forming apparatus 40 includes a cleaning liquid discharge unit (not depicted) for cleaning the wafer 11 held by the spinner table at a different position from the liquid-state resin discharge unit. Similarly to the liquid-state resin discharge unit, the cleaning liquid discharge unit has an arm with a substantially L-shape, a cleaning liquid discharge nozzle 46 (see FIG. 7C) that is disposed at the tip of this arm and discharges a cleaning liquid 48, and an electric motor that swings the arm. The cleaning liquid discharge nozzle 46 is connected to a cleaning liquid supply source (not depicted) through the arm.

The procedure of the protective film covering step (S5) will be described. First, the wafer 11 is placed on the sucking-holding part of the spinner table in such a manner that the side of the front surface 11a of the wafer 11 is opposed to the liquid-state resin discharge nozzle 42. Then, the side of the back surface 11b of the wafer 11 is sucked and held by the spinner table based on the negative pressure from the suction source. Next, the electric motor is driven to rotate the wafer 11 integrally with the spinner table. At this time, the cleaning liquid discharge nozzle 46 has been removed from the upper side of the spinner table.

Then, as depicted in FIG. 5A, with the rotation of the spinner table in the arrow direction at a low speed (for example, 30 rpm to 50 rpm), a liquid-state resin 44 is dropped from the liquid-state resin discharge nozzle 42 onto the wafer 11 while the liquid-state resin discharge nozzle 42 is swung in a circular arc manner above the spinner table in such a manner as to traverse the center of the rotation of the spinner table. The resin in the liquid state uniformly spreads over the front surface 11a of the wafer 11 and over the front surfaces of the bumps 15b due to the centrifugal force. The protective film 45 is formed with a thickness of substantially 1 μm to 20 μm, for example, to follow concavities and convexities on the side of the front surface 11a of the wafer 11 so as to reflect concavities and convexities of the bumps 15b and so forth (see FIG. 5B).

The protective film 45 is a resin film having heat resistance and chemical resistance and is a vinyl chloride film, for example. Although the protective film 45 is formed by using the spinner table mechanism in the present embodiment, instead of this, the protective film 45 with a sheet shape may be stuck to the side of the front surface 11a of the wafer 11. In the case of sticking the sheet-shaped protective film 45 to the side of the front surface 11a, the thickness of the protective film 45 can be adjusted in advance before being stuck to the side of the front surface 11a. For this reason, the thickness of the protective film 45 can be easily adjusted compared with the case of forming the protective film 45 by using the spinner table mechanism. For example, compared with the case of forming the protective film 45 by using the spinner table mechanism, the thickness of the protective film 45 can be set larger, specifically to substantially 5 μm to 200 μm.

Figure 5C:
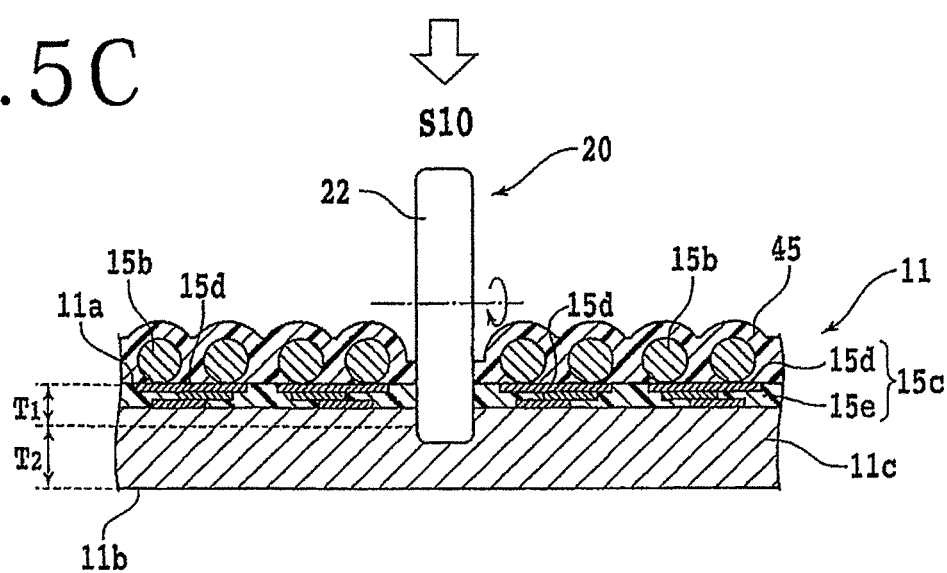
FIG. 5C is a diagram depicting the cut groove forming step (S10)
Figure 6A:
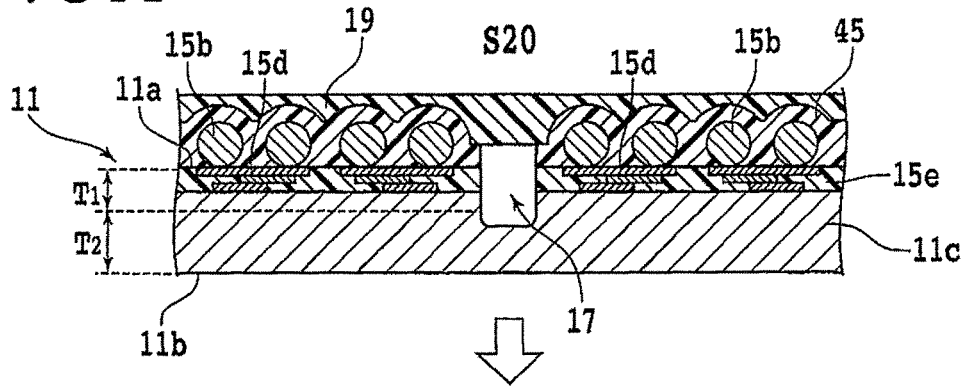
FIG. 6A is a diagram depicting the protective member sticking step (S20)

After the protective film covering step (S5), the cut groove forming step (S10) is carried out. FIG. 5C is a diagram depicting the cut groove forming step (S10). In the cut groove forming step (S10) of the second embodiment, the above-described cutting apparatus is used to cut the protective film 45 and form the cut groove 17 in the wafer 11 similarly to the first embodiment (see FIG. 6A). After the cut groove forming step (S10), the protective member sticking step (S20) is carried out. FIG. 6A is a diagram depicting the protective member sticking step (S20). Also in the protective member sticking step (S20) of the second embodiment, the above-described protective member sticking apparatus is used to stick the protective member 19 to the side of the front surface 11a of the wafer 11 and bring the protective member 19 into tight contact with the protective film 45. As above, in the second embodiment, the protective member 19 is disposed on the side of the front surface 11a of the wafer 11 through the protective film 45. Therefore, even if the adhesion layer of the protective member 19 is left over the front surface 11a of the wafer 11 and the bumps 15b after the protective member 19 is separated from the wafer 11, this adhesion layer can also be removed together when the protective film 45 is removed. For this reason, the adhesion layer of the protective member 19 can be prevented from being left over the front surface 11a of the semiconductor devices 21.

Figure 6B:
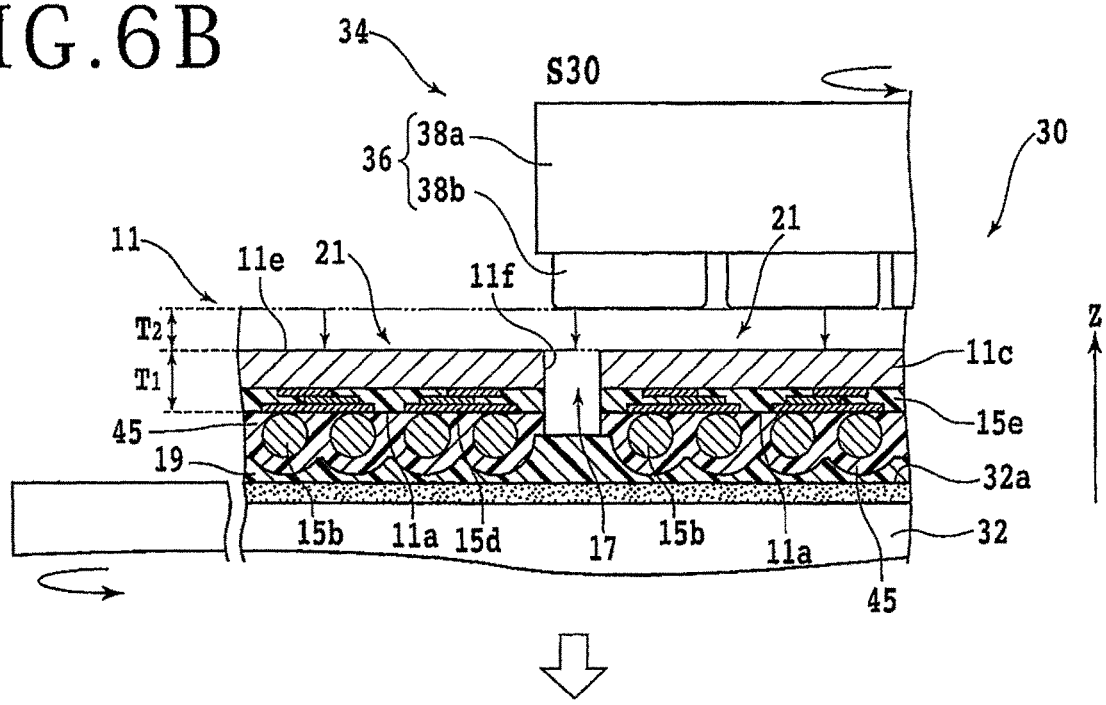
FIG. 6B is a diagram depicting the grinding step (S30)
Figure 6C:
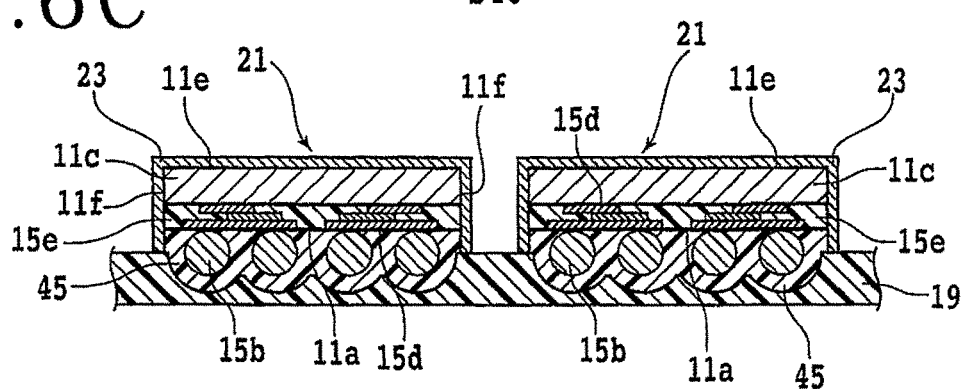
FIG. 6C is a diagram depicting the metal film covering step (S40)

After the protective member sticking step (S20), the grinding step (S30) is carried out. FIG. 6B is a diagram depicting the grinding step (S30). Also in the grinding step (S30) of the second embodiment, the side of the back surface 11b of the wafer 11 is removed by the thickness $T_2$ and the wafer 11 is processed to the finished thickness $T_1$. Thereby, the semiconductor substrate 11c is divided with the cut groove 17 being the border, so that the wafer 11 becomes the plural semiconductor devices 21. After the grinding step (S30), the metal film covering step (S40) is carried out. FIG. 6C is a diagram depicting the metal film covering step (S40). Also in the metal film covering step (S40) of the second embodiment, the metal film 23 is formed on the back surfaces 11e and the side surfaces 11f of the semiconductor devices 21 by PVD or CVD.

Figure 7A:
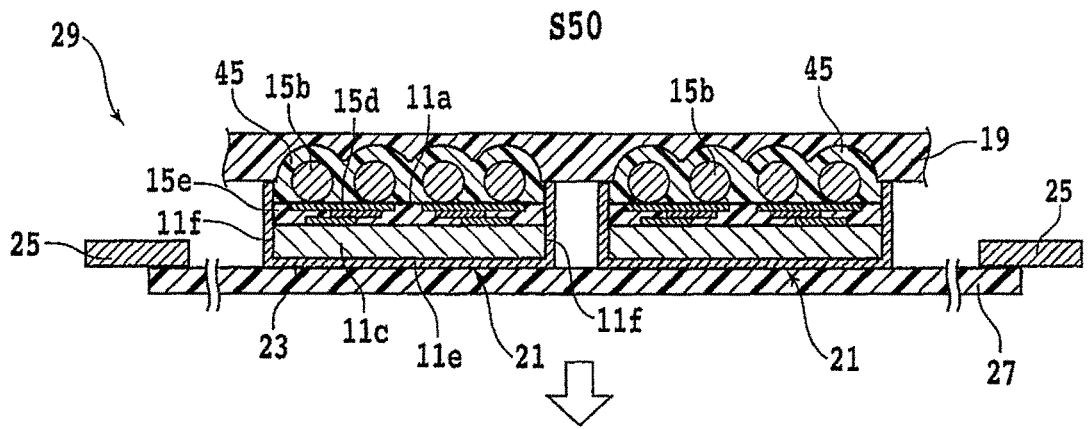
FIG. 7A is a diagram depicting the adhesion tape sticking step (S50)
Figure 7B:
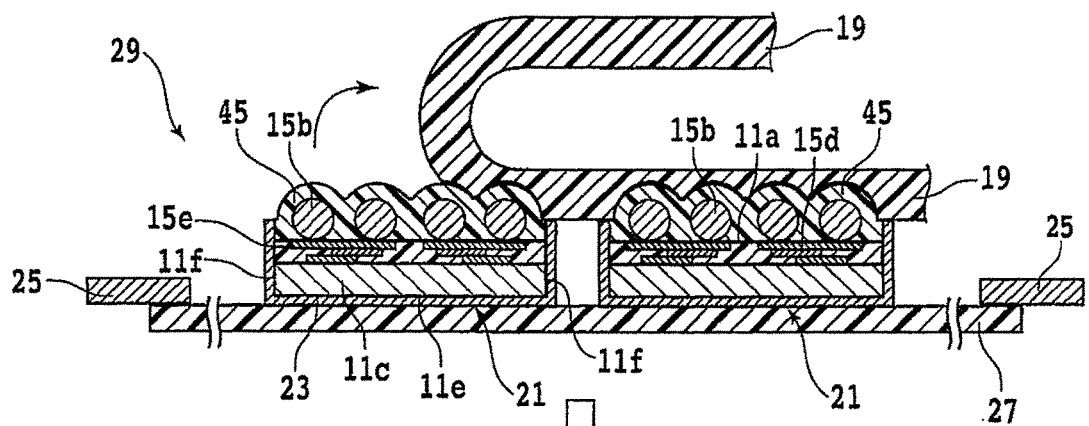
FIG. 7B is a diagram depicting the protective member removing step (S60)

After the metal film covering step (S40), the adhesion tape sticking step (S50) is carried out. FIG. 7A is a diagram depicting the adhesion tape sticking step (S50). In the adhesion tape sticking step (S50), the frame unit 29 is formed similarly to the first embodiment. After the adhesion tape sticking step (S50), the protective member 19 is removed from the side of the front surface 11a of the wafer 11 (protective member removing step (S60)). FIG. 7B is a diagram depicting the protective member removing step (S60). The protective film 45 is in tight contact with the side of the front surface 11a of the wafer 11 and the protective film 45 is not completely peeled off from the side of the front surface 11a in the protective member removing step (S60).

Figure 7C:
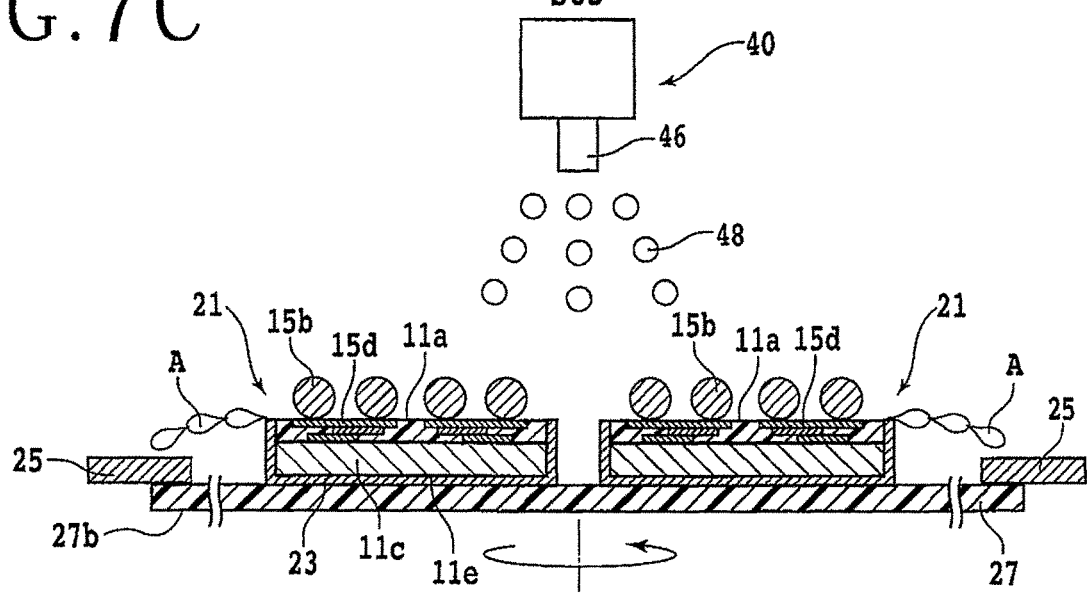
FIG. 7C is a diagram depicting a protective film removing step (S65)

In view of this, in the manufacturing method of the semiconductor device 21 with the metal film 23 according to the second embodiment, a protective film removing step (S65) of removing the protective film 45 is carried out after the protective member removing step (S60). In the protective film removing step (S65), the protective film 45 is removed by using the protective film forming apparatus 40 that doubles as a cleaning apparatus. FIG. 7C is a diagram depicting the protective film removing step (S65). The procedure of removing the protective film 45 will be described. First, the surface of the adhesion tape 27 on the opposite side to the semiconductor devices 21 (i.e. the side of a back surface 27b) is placed on the sucking-holding part of the spinner table in such a manner that the side of the front surface 11a is positioned to the upper side. Then, the side of the back surface 27b of the adhesion tape 27 is sucked and held by the spinner table based on the negative pressure of the suction source. Next, the electric motor is driven to rotate the frame unit 29 integrally with the spinner table. At this time, the liquid-state resin discharge nozzle 42 has been removed from the upper side of the spinner table.

Then, with rotation of the spinner table at, for example, 800 rpm, the cleaning liquid 48 (for example, isopropyl alcohol (IPA)) is dropped onto the wafer 11 while the cleaning liquid discharge nozzle 46 is swung in a circular arc manner above the spinner table. As depicted in FIG. 7C, the protective film 45 is dissolved in the cleaning liquid 48 to become used liquid A. Used liquid A is blown off to the outside of the semiconductor device 21 by the centrifugal force and is received by the liquid receiving container. In this manner, the protective film 45 is removed from the side of the front surface 11a of the wafer 11 by the cleaning liquid 48. If the protective film 45 with a sheet shape is stuck to the front surface 11a, the protective film 45 may be peeled off like peeling off the protective member 19 in the protective member removing step (S60).

Figure 8:
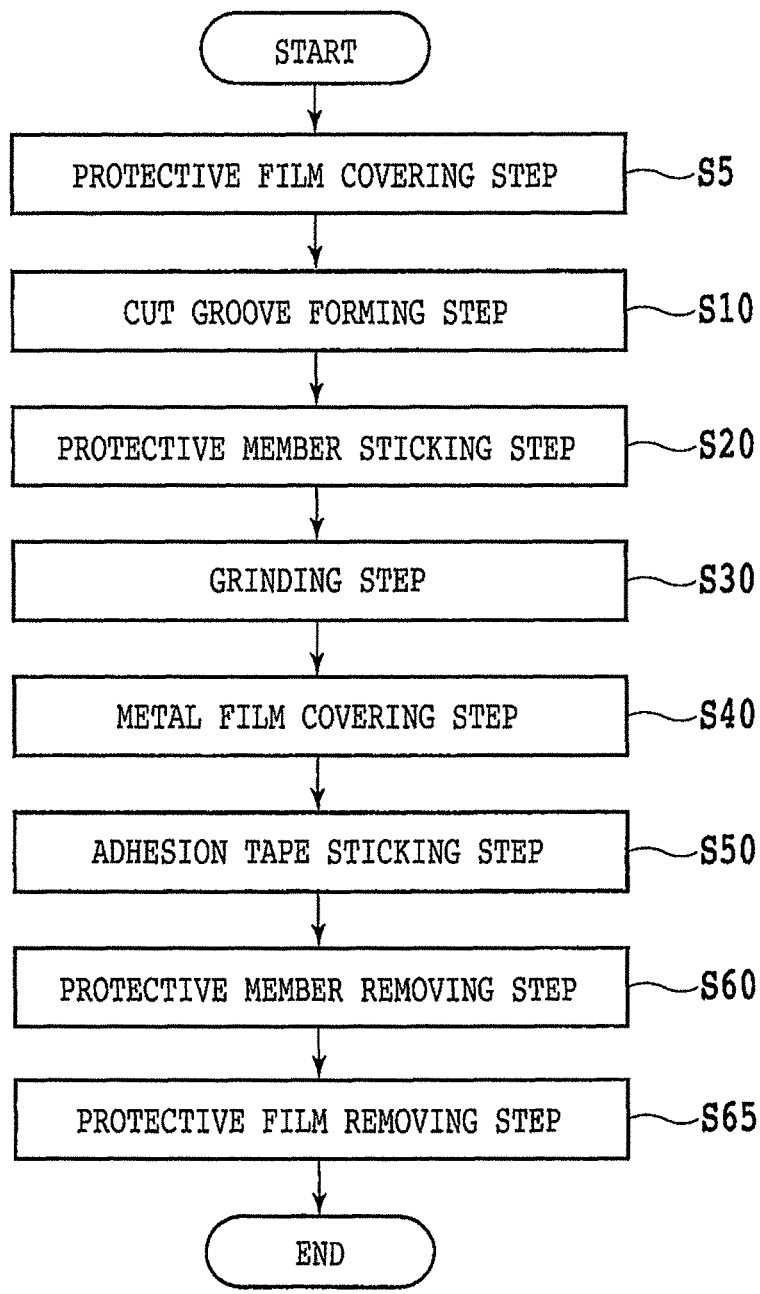
FIG. 8 is a flowchart of a manufacturing method of a semiconductor device with a metal film according to a second embodiment.

FIG. 8 is a flowchart of the manufacturing method of the semiconductor device 21 with the metal film 23 according to the second embodiment. In the second embodiment, the protective member 19 is disposed on the side of the front surface 11a of the wafer 11 through the protective film 45 and therefore the adhesion layer of the protective member 19 can be prevented from being left over the front surface 11a of the semiconductor devices 21. Furthermore, also in the second embodiment, similarly to the first embodiment, the metal film 23 can be formed directly on the back surfaces 11e and the side surfaces 11f of the semiconductor devices 21 and the space necessary for mounting the electromagnetic wave shield can be reduced. Moreover, the metal film 23 is formed for all semiconductor devices 21 all at once and therefore the semiconductor devices 21 can be efficiently covered by the electromagnetic wave shield.

Figure 9A:
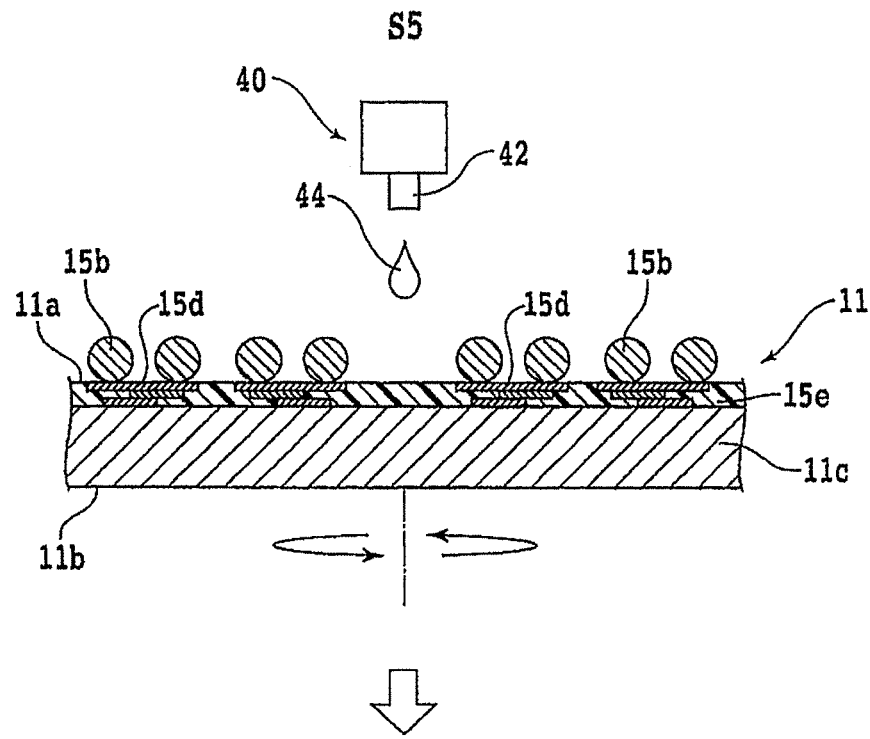
FIG. 9A is a diagram depicting the protective film covering step (S5)

Next, a third embodiment will be described by using FIG. 9A to FIG. 14. In the third embodiment, first, the protective film 45 is formed on the side of the front surface 11a of the wafer 11 by using the protective film forming apparatus 40 similarly to the second embodiment (protective film covering step (S5)). FIG. 9A is a diagram depicting the protective film covering step (S5). In the third embodiment, after the protective film covering step (S5) and before the cut groove forming step (S10), the side of the front surface 11a of the wafer 11 for which the protective film 45 has been formed is irradiated with a laser beam L and laser-processed grooves 51 and so forth are formed along the planned dividing lines 13.

Figure 9B:
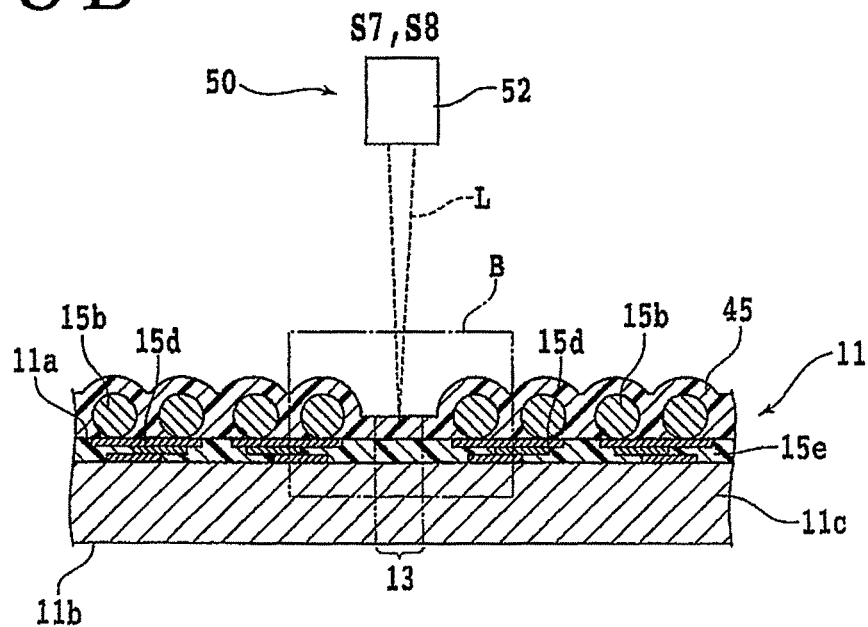
FIG. 9B is a partial sectional side view depicting how to process the front surface side of the wafer by a laser beam.
Figure 10A:
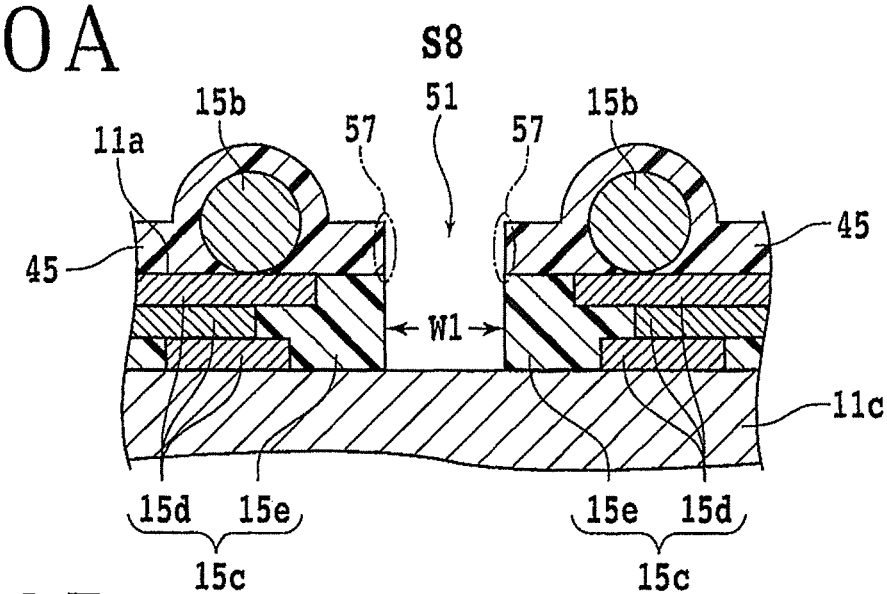
FIG. 10A is an enlarged view depicting a laser-processed groove.

FIG. 9B is a partial sectional side view depicting how to process the side of the front surface 11a of the wafer 11 by the laser beam L. For example, by irradiation with the laser beam L, the protective film 45 and the functional layer 15c are subjected to ablation and the laser-processed groove 51 is formed (laser-processed groove forming step (S8)). FIG. 10A is an enlarged view depicting the laser-processed groove 51. FIG. 10A depicts region B in FIG. 9B.

The laser-processed groove forming step (S8) is carried out by using a laser processing apparatus 50. The laser processing apparatus 50 has a chuck table (not depicted) that sucks and holds the side of the back surface 11b of the wafer 11. Furthermore, at a position opposed to the chuck table, a processing head 52 that irradiates the side of the front surface 11a of the wafer 11 held by the chuck table with the laser beam L in a pulse manner is disposed. The laser beam L has a wavelength having absorbability with respect to the protective film 45 and the wafer 11 (i.e. such a wavelength as to be absorbed by the protective film 45 and the wafer 11), for example, a wavelength of 355 nm. A holding surface of the chuck table is connected to a suction source (not depicted) through a suction path (not depicted) and so forth formed inside the chuck table. By causing a negative pressure of the suction source to act on the holding surface, the side of the back surface 11b of the wafer 11 is sucked and held by the chuck table. Moreover, a support table (not depicted) is disposed under the chuck table and this support table moves along a predetermined direction (for example, X-axis direction) by a movement mechanism of a ball screw system.

When the protective film 45 and the wafer 11 are processed by the laser beam L, for example, one planned dividing line 13 is set parallel to the X-axis direction, in which the chuck table moves. Then, the processing head 52 and the chuck table are relatively moved in the X-axis direction while the side of the front surface 11a of the wafer 11 is irradiated with the laser beam L. The irradiation with the laser beam L may be carried out one time or plural times along one planned dividing line 13 although depending also on the width of the laser beam L. Thereby, the protective film 45 and the functional layer 15c are subjected to ablation processing and are removed along the planned dividing line 13 and the laser-processed groove 51 that reaches the semiconductor substrate 11c is formed along the planned dividing line 13.

Furthermore, by moving the chuck table in the Y-axis direction and rotating it, the laser-processed grooves 51 are formed along all planned dividing lines 13. The laser-processed groove 51 has a width W1 larger than a width W4 (see FIG. 11B) of the cut groove 17 formed in the subsequent cut groove forming step (S10) (i.e. W4<W1). In the present embodiment, the laser-processed groove 51 with the width W1 is formed by the laser beam L. Then, in the subsequent cut groove forming step (S10), the cutting blade 20 is positioned in this width W1 and the semiconductor substrate 11c is cut by the cutting blade 20. Due to this, compared with the case of cutting the functional layer 15c and the protective film 45 by the cutting blade 20, film separation and so forth of the functional layer 15c can be prevented and therefore cutting processing with higher quality is enabled. Moreover, by the protective film 45, debris generated at the time of ablation processing can be prevented from adhering to the device regions 15a.

Meanwhile, in the subsequent metal film covering step (S40), the metal film 23 is formed in the laser-processed groove 51. At this time, the metal film 23 is formed also on side parts 57 of the protective film 45 exposed to the inside of the laser-processed groove 51. However, the protective film 45 is finally removed in the protective film removing step (S65). Thus, the metal film 23 made on the side parts 57 of the protective film 45 becomes the state of protruding in the space and the metal film 23 made on side surfaces of the functional layer 15c exposed to the inside of the laser-processed groove 51 becomes easy to separate due to a slight trigger. For this reason, possibly the effect of the electromagnetic wave shield by the metal film 23 is reduced. In view of this, in a first modification example of the third embodiment, a step part is formed by exposing part of the functional layer 15c from the protective film 45. In this first modification example, after the protective film covering step (S5) and before the laser-processed groove forming step (S8), the protective film 45 is irradiated with the laser beam L along the planned dividing line 13. The protective film 45 is subjected to ablation and is removed along the planned dividing line 13 and a protective film removal line 53 is formed (protective film removal line forming step (S7)).

Figure 10B:
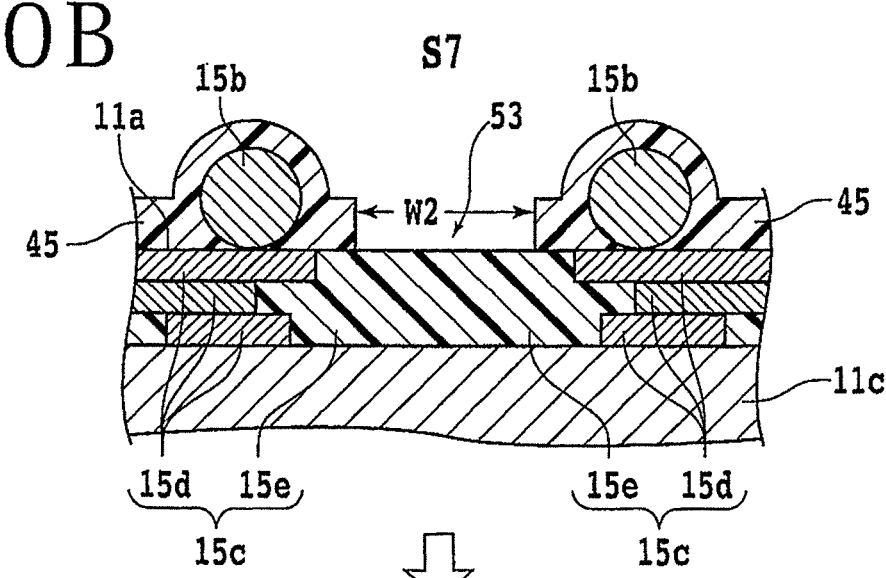
FIG. 10B is an enlarged view depicting a protective film removal line.

This protective film removal line 53 has a width W2 larger than both of a width W3 of a laser-processed groove 55 formed in the laser-processed groove forming step (S8) and the width W4 of the cut groove 17 formed in the cut groove forming step (S10). FIG. 10B is an enlarged view of the protective film removal line 53. FIG. 10B depicts region B in FIG. 9B. For example, after the spot of the laser beam L on the protective film 45 is adjusted to a wide width shape corresponding to the width W2, the side of the front surface 11a of the wafer 11 is irradiated with the laser beam L along the planned dividing line 13. This can form the protective film removal line 53. Furthermore, instead of adjusting the spot to the wide width shape, the spot of the laser beam L on the protective film 45 may be set to a circular shape. In this case, the side of the front surface 11a of the wafer 11 is irradiated with the laser beam L in such a manner that the loci of the laser beam L partly overlap in the width direction of the width W2 (i.e. direction orthogonal to the planned dividing line 13).

After the protective film removal line forming step (S7), the functional layer 15c located inside the width W2 is irradiated with the laser beam L from the side of the front surface 11a of the wafer 11 and the laser-processed groove 55 is formed (laser-processed groove forming step (S8)). The laser-processed groove 55 has the width W3 that is larger than the width W4 of the cut groove 17 and is smaller than the width W2 of the protective film removal line 53 (i.e. W4<W3<W2). For example, in the laser-processed groove forming step (S8) of the first modification example, the power density (W/cm$^2$) is set higher by focusing the laser beam L compared with the protective film removal line forming step (S7) and the functional layer 15c located inside the width W2 is subjected to ablation. This can form the laser-processed groove 55 that has the width W3 smaller than the protective film removal line 53 and reaches the semiconductor substrate 11c.

Figure 10C:
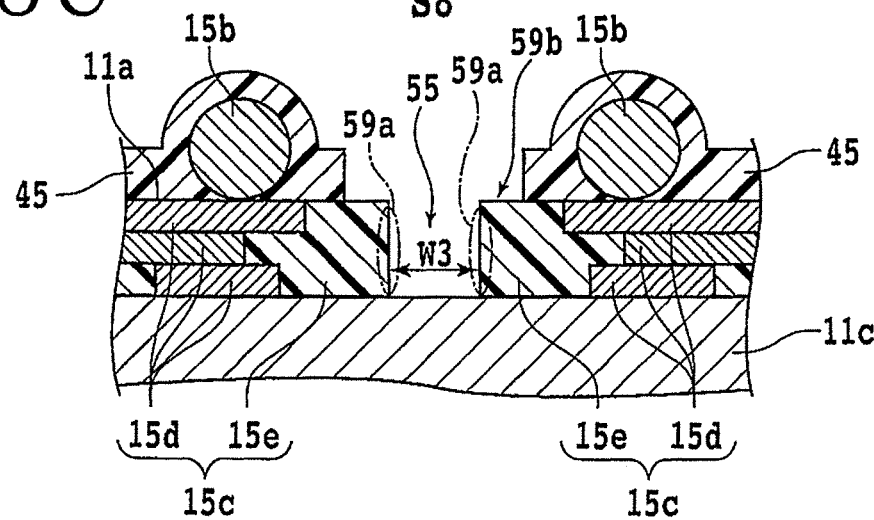
FIG. 10C is an enlarged view of a laser-processed groove formed in a laser-processed groove forming step (S8) after a protective film removal line forming step (S7)

FIG. 10C is an enlarged view depicting the laser-processed groove 55 formed in the laser-processed groove forming step (S8) of the first modification example after the protective film removal line forming step (S7). FIG. 10C depicts region B in FIG. 9B. As depicted in FIG. 10C, in the first modification example, step parts 59b each composed of a side part 59a of the functional layer 15c exposed inside the laser-processed groove 55 and the upper surface of the functional layer 15c of the region from which the protective film 45 has been removed is formed. In the subsequent metal film covering step (S40), the metal film 23 is formed in contact with the step parts 59b of the functional layer 15c. In particular, the metal film 23 is formed on the upper surface of the functional layer 15c. Thus, the metal film 23 can get tight contact with the functional layer 15c more firmly compared with the case of forming the metal film 23 in the laser-processed groove 51 depicted in FIG. 10A. Therefore, the metal film 23 is less readily peeled off from the side parts 59a of the functional layer 15c compared with the example depicted in FIG. 10A.

Figure 11A:
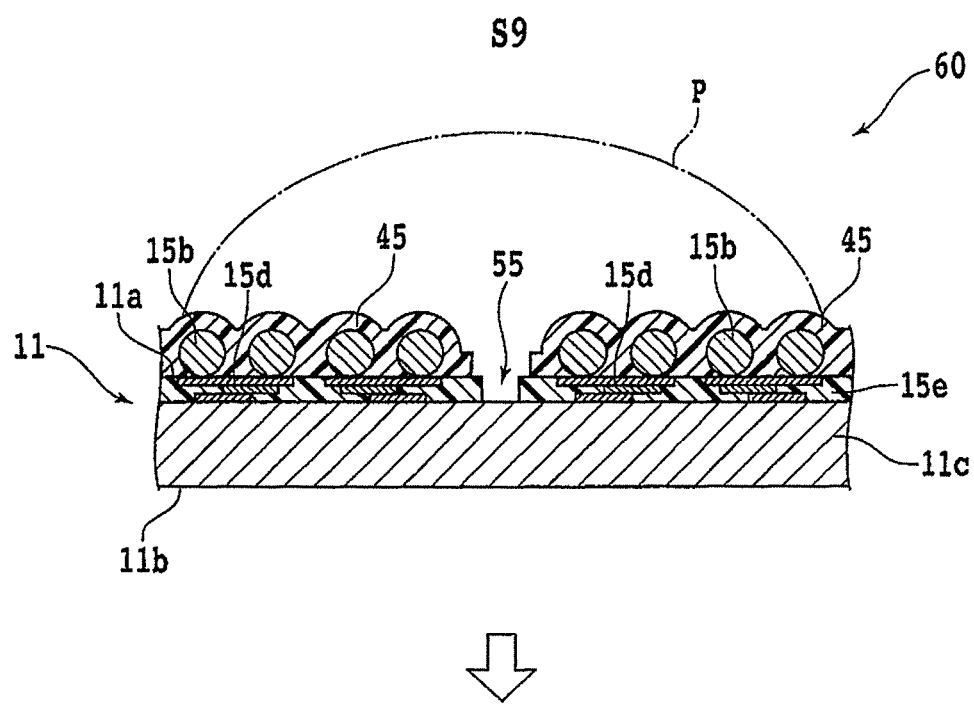
FIG. 11A is a diagram depicting a debris removing step (S9)

In the third embodiment, a debris removing step (S9) is carried out after the laser-processed groove forming step (S8) or after the protective film removal line forming step (S7) and the laser-processed groove forming step (S8), and, before the protective member sticking step (S20). Thereby, debris of the functional layer 15c adhering to the laser-processed groove 55 is removed. FIG. 11A is a diagram depicting the debris removing step (S9). Hereinafter, the wafer 11 that has gone through the protective film removal line forming step (S7) and the laser-processed groove forming step (S8) described as the first modification example of the third embodiment is depicted in drawings.

The debris removing step (S9) is carried out by using a plasma etching apparatus 60. The plasma etching apparatus 60 of the present embodiment is a remote plasma etching apparatus that turns an etching gas to a plasma state and thereafter introduces this etching gas in the plasma state into a vacuum chamber. The plasma etching apparatus 60 includes the vacuum chamber (not depicted) internally having a treatment space. Furthermore, a table base (not depicted) for supporting the wafer 11 is disposed in the treatment space. On the upper surface of a circular disc part of the table base, an electrostatic chuck table (not depicted) having a circular disc shape with a smaller diameter than the circular disc part is disposed. The electrostatic chuck table includes a table main body formed of an insulating material and plural electrodes buried in the table main body, and adsorbs and holds the wafer 11 by static electricity generated in each electrode. Each electrode is connected to a direct-current power supply that can generate a high voltage of substantially 5 kV, for example.

A supply nozzle (not depicted) that supplies a source gas in a plasma state to the wafer 11 held by the electrostatic chuck table is disposed in an upper wall of the vacuum chamber. On the upstream side of a flow path connected to the supply nozzle, each of one or more gas supply sources (not depicted) is connected in parallel through a valve (not depicted), a flow rate controller (not depicted), and so forth. The number of kinds of gases supplied from the one or more gas supply sources may be changed according to the debris to be removed. The debris derives mainly from the functional layer 15c. For example, if the low-dielectric-constant insulator layer 15e in the functional layer 15c is an oxide of a carbon-containing silicon oxide-based substance (SiOCHbased substance), a gas containing perfluorocyclobutane ($C_4F_8$) or sulfur hexafluoride ($SF_6$) is supplied from the gas supply source. Furthermore, for example, if the low-dielectric-constant insulator layer 15e in the functional layer 15c is an organic substance different from a carbon-containing silicon oxide-based substance, a gas containing hydrogen ($H_2$) is supplied from a first gas supply source and a gas containing nitrogen ($N_2$) is supplied from a second gas supply source.

An electrode for applying a high-frequency voltage to a mixture gas that flows in the supply nozzle is disposed between a supply port formed at the downstream end of the supply nozzle and the gas supply source. A high-frequency power supply is connected to this electrode. The high-frequency power supply supplies power of substantially 0.5 to 5 kW to the electrode with a high-frequency voltage of substantially 450 kHz to 2.45 GHz (for example, 13.56 MHz). By causing the high-frequency voltage to act on the mixture gas that flows in the supply nozzle by using the high-frequency power supply and so forth, the mixture gas can be turned to plasma (typically turned to radicals or ions). The mixture gas in the plasma state is supplied from the supply port of the supply nozzle to the treatment space.

In the debris removing step (S9) of the present embodiment, first, the wafer 11 is carried in to the treatment space of the vacuum chamber of the above-described remote plasma etching apparatus and the side of the back surface 11b of the wafer 11 is placed on the upper surface of the electrostatic chuck table in such a manner that the side of the front surface 11a of the wafer 11 is exposed upward. Thereafter, a direct-current voltage is applied to the electrodes of the electrostatic chuck table and the wafer 11 is adsorbed and held by the electrostatic chuck table based on static electricity. Furthermore, the treatment space is evacuated and the treatment space is depressurized to substantially 200 Pa, for example.

Thereafter, the source gas, an inert gas, and so forth are supplied from the respective gas supply sources at predetermined flow rates. Furthermore, a high-frequency voltage is supplied from the high-frequency power supply to the electrode and a mixture gas of the source gas and the inert gas is turned to plasma (turned to radicals, ions, or the like). This can supply an etching gas P in the plasma state from the supply port of the supply nozzle to the treatment space. The etching gas P in the plasma state supplied from the supply port is supplied to the side of the front surface 11a of the wafer 11 disposed below the supply port and removes debris that exists in the laser-processed groove 55. This allows the metal film 23 formed in the subsequent metal film covering step (S40) to get tight contact with the functional layer 15c more firmly compared with the case in which the debris is not removed by the etching gas P. In the debris removing step (S9), the debris may be removed by supplying a reactive gas that is not turned to plasma to the laser-processed groove 55. As the reactive gas, chlorine trifluoride ($ClF_3$), xenon difluoride ($XeF_2$), or the like is used, for example. Moreover, the debris may be removed by supplying a mixture gas of the reactive gas and an inert gas such as nitrogen ($N_2$), argon (Ar), or helium (He).

Figure 11B:
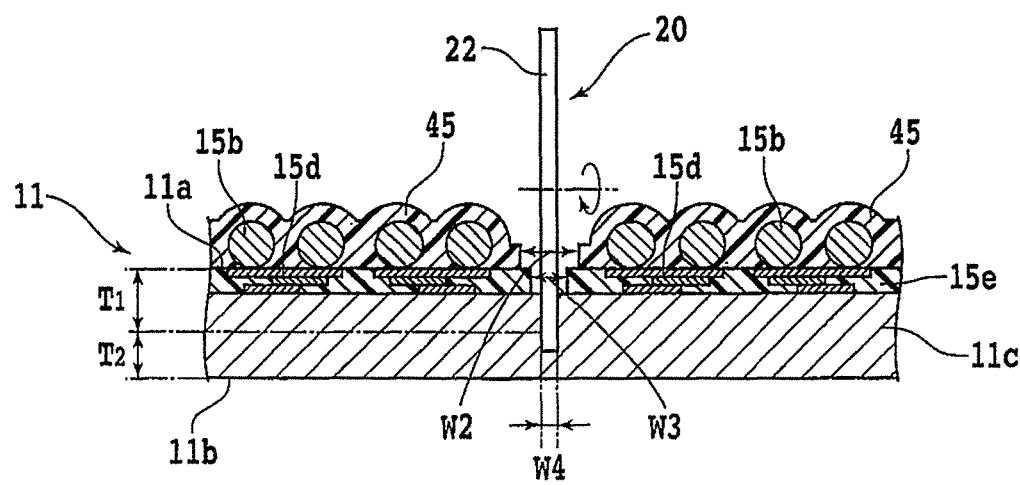
FIG. 11B is a diagram depicting the cut groove forming step (S10)
Figure 12A:
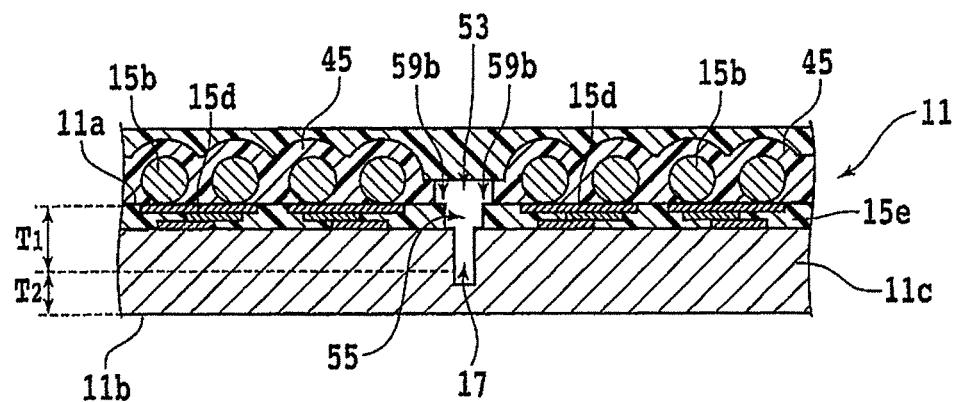
FIG. 12A is a diagram depicting the protective member sticking step (S20)

After the debris removing step (S9), the cut groove forming step (S10) is carried out. FIG. 11B is a diagram depicting the cut groove forming step (S10). In the cut groove forming step (S10), the cut groove 17 with the width W4 is formed inside the laser-processed groove 55 by using the above-described cutting apparatus. After the cut groove forming step (S10), the protective member sticking step (S20) is carried out. FIG. 12A is a diagram depicting the protective member sticking step (S20). In the protective member sticking step (S20), the protective member 19 is disposed on the side of the front surface 11a of the wafer 11 by using the above-described protective member sticking apparatus. The protective member 19 gets tight contact with the protective film 45 but does not get contact with the front surface 11a of the wafer 11. Therefore, a space is formed between the upper surface of the functional layer 15c at the step parts 59b and the surface of the protective member 19 on the side of the wafer 11.

Figure 12B:
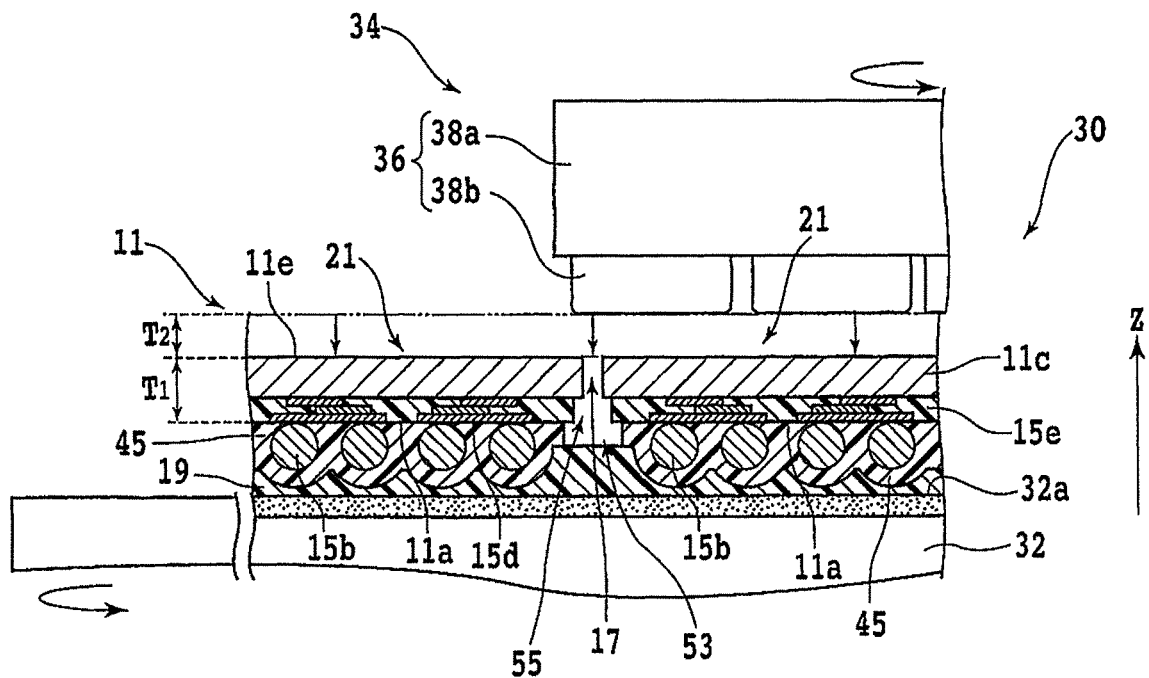
FIG. 12B is a diagram depicting the grinding step (S30)
Figure 13A:
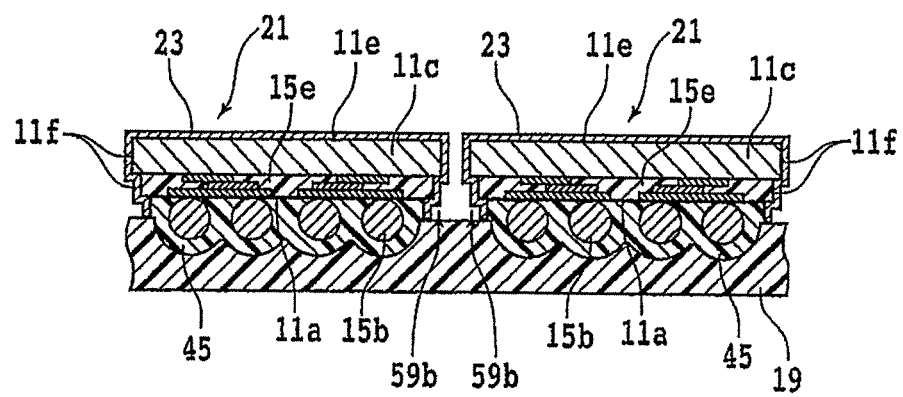
FIG. 13A is a diagram depicting the metal film covering step (S40)

After the protective member sticking step (S20), the grinding step (S30) is carried out. FIG. 12B is a diagram depicting the grinding step (S30). For example, the wafer 11 is processed to the finished thickness $T_1$ by using the above-described grinding apparatus 30. Thereby, the wafer 11 is divided into the semiconductor devices 21. After the grinding step (S30), the metal film covering step (S40) is carried out. FIG. 13A is a diagram depicting the metal film covering step (S40). For example, by using the above-described sputtering apparatus, the metal film 23 is formed on the back surfaces 11e, the side surfaces 11f, and the upper surfaces of the step parts 59b in the semiconductor devices 21 by a high-frequency magnetron sputtering method. As described above, the metal film 23 is formed on the upper surface of the functional layer 15c at the step parts 59b. Therefore, even when the protective film 45 is removed, the metal film 23 is less readily peeled off from the side surfaces of the functional layer 15c (i.e. surfaces of the side parts 59a). Due to this, the metal film 23 is less readily peeled off from the side surfaces 11f of the semiconductor devices 21 even through the protective film removing step (S65).

Figure 13B:
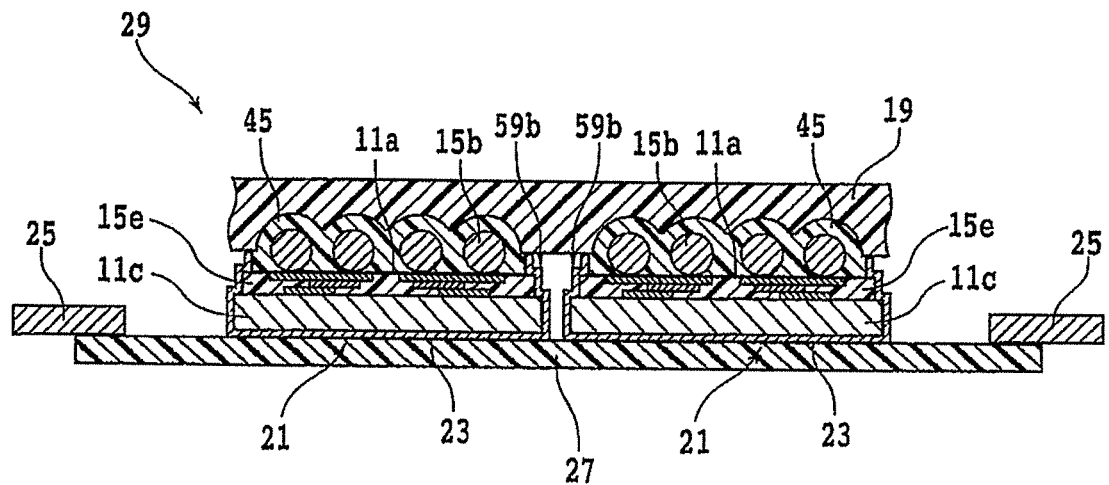
FIG. 13B is a diagram depicting the adhesion tape sticking step (S50)

After the metal film covering step (S40) and before the protective member removing step (S60), the adhesion tape sticking step (S50) is carried out. FIG. 13B is a diagram depicting the adhesion tape sticking step (S50). In the adhesion tape sticking step (S50), as described above, the protective member 19 and the plural semiconductor devices 21 are integrated with the ring-shaped frame 25 and the circular adhesion tape 27 to form the frame unit 29. Due to the forming of the frame unit 29, handling of the plural semiconductor devices 21 in the respective subsequent steps becomes easier compared with the case in which the frame unit 29 is not formed.

After the adhesion tape sticking step (S50), the protective member removing step (S60) is carried out. As described above, in the protective member removing step (S60), the adhesion force of the adhesion layer of the protective member 19 is lowered by using an ultraviolet irradiation apparatus or a heating apparatus and thereafter the protective member 19 is peeled off from the side of the front surface 11a of the wafer 11. If the protective member 19 does not have the adhesion layer, the protective member 19 may be peeled off from the side of the front surface 11a without treating the protective member 19 by an ultraviolet ray or the like. After the protective member removing step (S60), the protective film removing step (S65) is carried out. As described above, in the protective film removing step (S65), the protective film 45 is removed by using the protective film forming apparatus 40 that doubles as a cleaning apparatus. Furthermore, after the protective film removing step (S65), the individual semiconductor devices 21 may be taken out from the adhesion tape 27 by using the above-described pickup apparatus (not depicted) or the like. This can obtain the semiconductor devices 21 having the metal film 23 on the order of micrometers as an electromagnetic wave shield.

Figure 14:
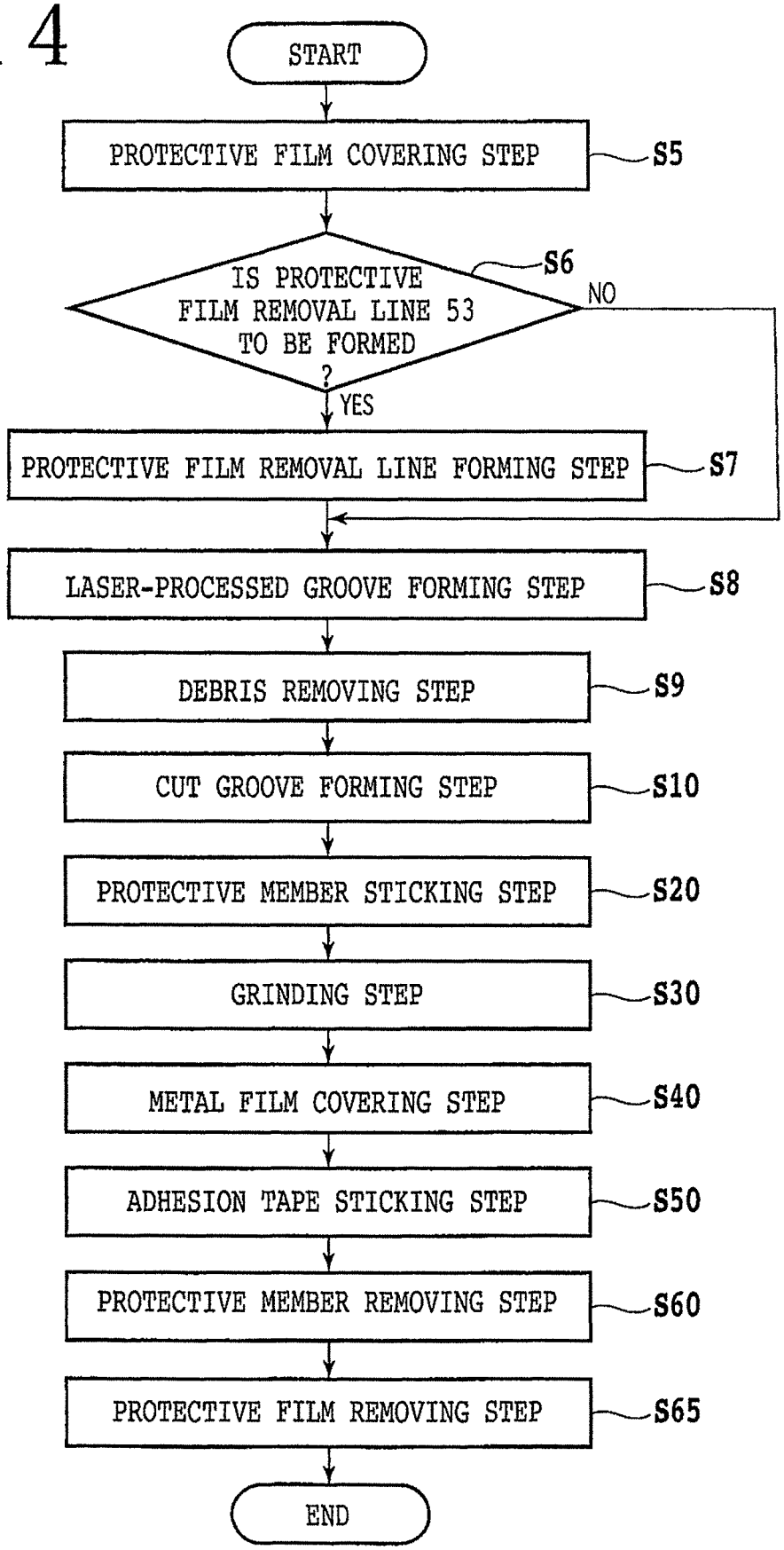
FIG. 14 is a flowchart of a manufacturing method of a semiconductor device with a metal film according to a third embodiment.

FIG. 14 is a flowchart of the manufacturing method of the semiconductor device 21 with the metal film 23 according to the third embodiment. In the third embodiment, in the case of forming the protective film removal line 53 (YES in FIG. 6), the protective film removal line forming step (S7) and the laser-processed groove forming step (S8) are sequentially carried out and the process proceeds to the debris removing step (S9). In contrast, if the protective film removal line 53 is not formed (NO in S6), only the laser-processed groove forming step (S8) is carried out and the process proceeds to the debris removing step (S9).

Figure 15A:
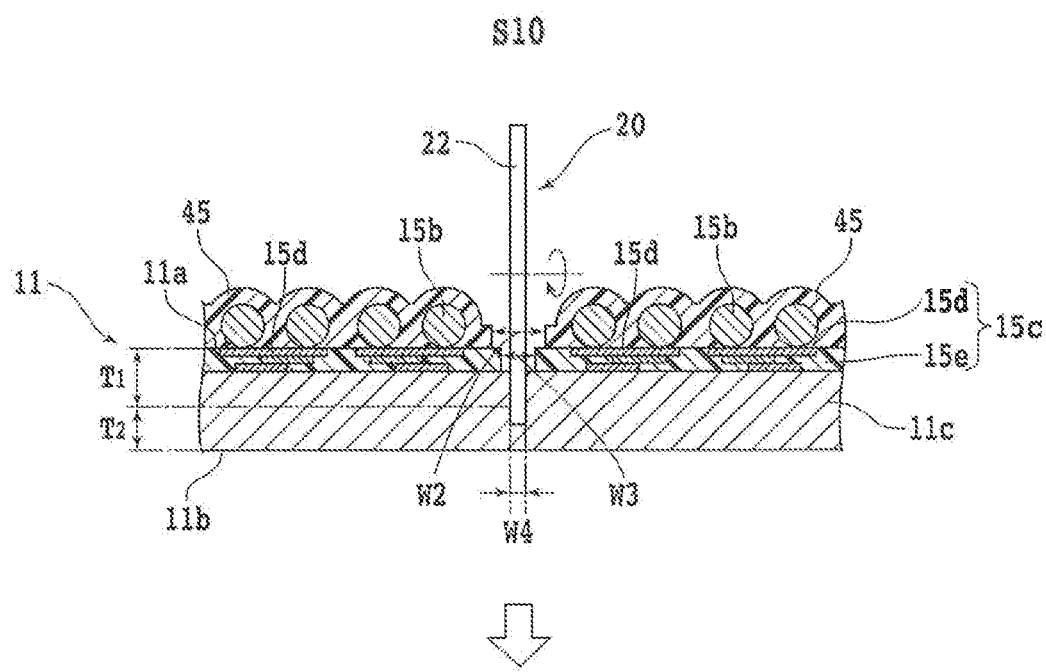
FIG. 15A is a diagram depicting the cut groove forming step (S10)
Figure 15B:
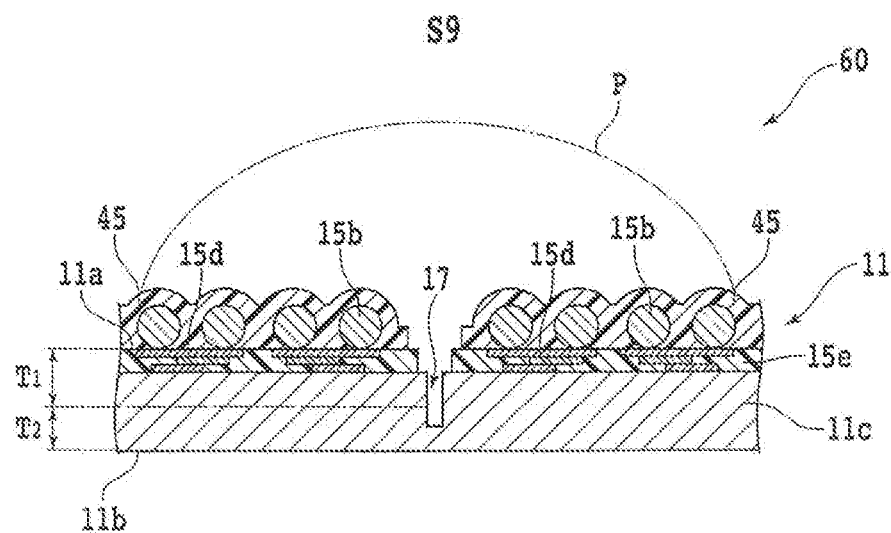
FIG. 15B is a diagram depicting the debris removing step (S9) according to a second modification example.

Next, a second modification example of the third embodiment will be described. In the second modification example, after the laser-processed groove forming step (S8), the cut groove forming step (S10) and the debris removing step (S9) are carried out in this order. The second modification example is different from the first modification example in this point. In the second modification example of the third embodiment, the cut groove forming step (S10) is carried out by using the above-described cutting apparatus after the laser-processed groove forming step (S8). FIG. 15A is a diagram depicting the cut groove forming step (S10). Then, after the cut groove forming step (S10) and before the subsequent protective member sticking step (S20), treatment of the wafer 11 is carried out with the etching gas P turned to plasma and debris adhering to the laser-processed groove 55 and the cut groove 17 is removed (debris removing step (S9)). FIG. 15B is a diagram depicting the debris removing step (S9) according to the second modification example.

In the second modification example of the third embodiment, debris generated in the cut groove 17 in addition to debris of the functional layer 15c generated due to laser ablation is removed by the etching gas P. Due to this, compared with the case in which treatment is not carried out with the etching gas P, the metal film 23 formed in the subsequent metal film covering step (S40) can be brought into tight contact with the semiconductor substrate 11c and the functional layer 15c more firmly, for example. The protective member sticking step (S20) is carried out after the debris removing step (S9). The subsequent steps are the same as the third embodiment. As described above, in the debris removing step (S9), the debris may be removed by supplying a reactive gas that is not turned to plasma to the laser-processed groove 55 or the debris may be removed by a mixture gas of the reactive gas and an inert gas.

Next, a fourth embodiment will be described by using FIG. 16A to FIG. 18. In the following, the difference between the third embodiment and the fourth embodiment will be mainly described. Also in the fourth embodiment, first, steps from the protective film covering step (S5) to the cut groove forming step (S10) are carried out similarly to the third embodiment. After the cut groove forming step (S10), the protective member sticking step (S20) is carried out. However, the protective member 19 stuck to the side of the front surface 11a of the wafer 11 in the protective member sticking step (S20) of the fourth embodiment is an adhesion tape that expands in the radial direction by an external force (i.e. having expandability).

Figure 16A:
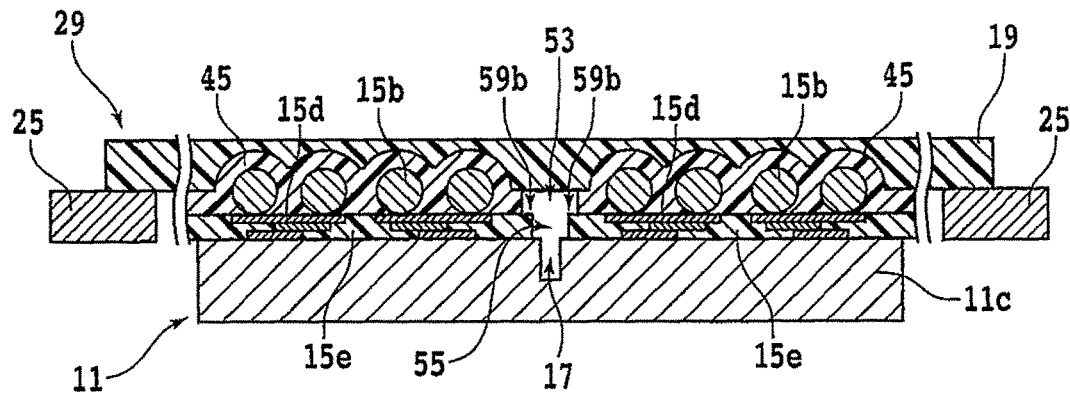
FIG. 16A is a diagram depicting the protective member sticking step (S20)
Figure 16B:
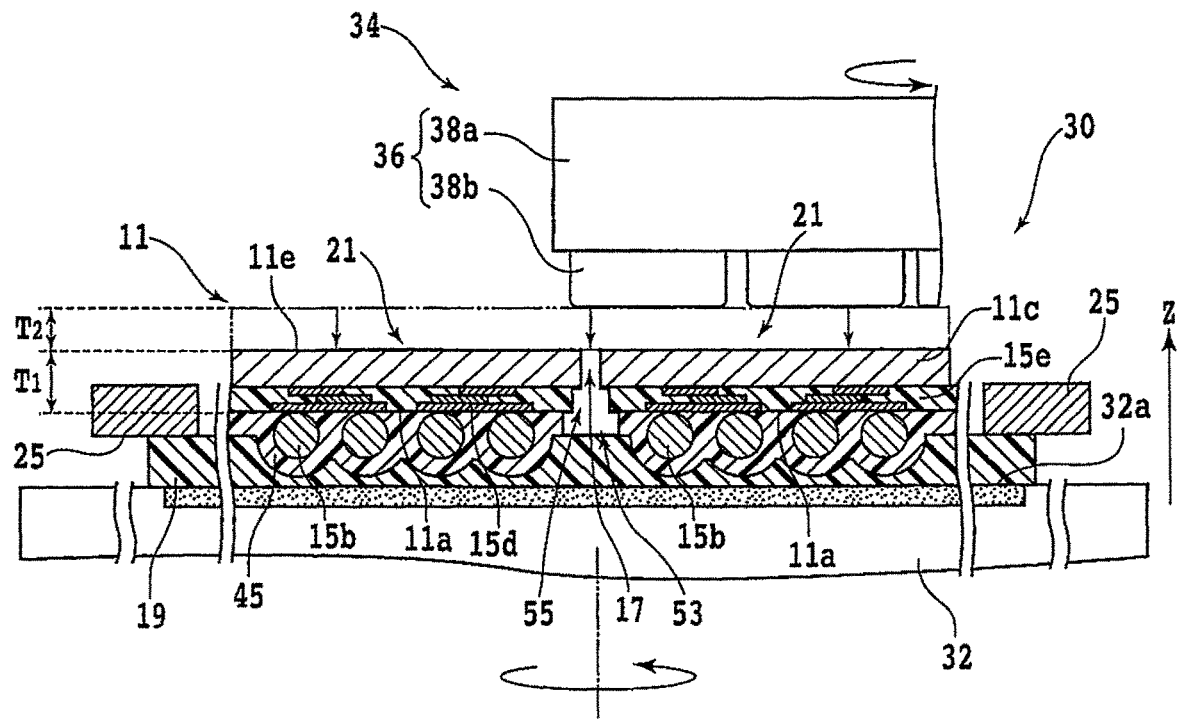
FIG. 16B is a diagram depicting the grinding step (S30)

In the protective member sticking step (S20), in the state in which the wafer 11 with the protective film 45 formed on the side of the front surface 11a is disposed in the opening part of the ring-shaped frame 25 made of a metal, the protective member 19 is stuck to the frame 25 and the side of the front surface 11a of the wafer 11 by using the above-described protective member sticking apparatus (not depicted). Thereby, the frame unit 29 in which the wafer 11, the frame 25, the protective member 19, and so forth are integrated is formed. FIG. 16A is a diagram depicting the protective member sticking step (S20). After the protective member sticking step (S20), the grinding step (S30) is carried out by using the above-described grinding apparatus 30 and the wafer 11 is divided into the plural semiconductor devices 21. FIG. 16B is a diagram depicting the grinding step (S30).

Figure 17A:
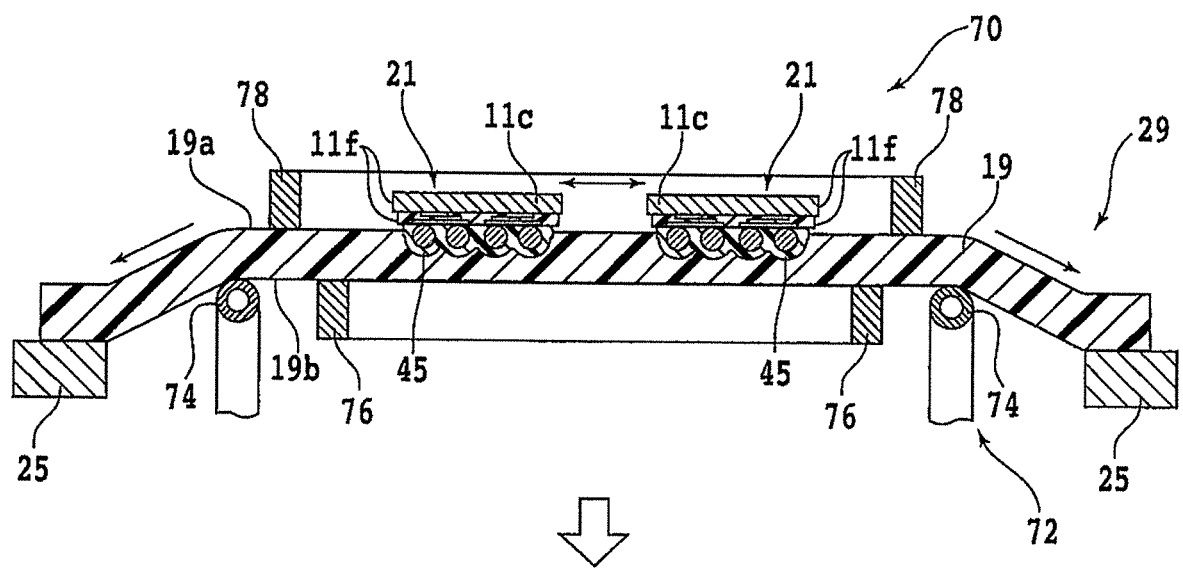
FIG. 17A is a diagram depicting an expanding step (S35)

After the grinding step (S30) and before the metal film covering step (S40), the protective member 19 is expanded to widen the interval between the individual semiconductor devices 21 (expanding step (S35)). In the expanding step (S35), the protective member 19 is expanded in the radial direction by using an expanding apparatus 70, for example. FIG. 17A is a diagram depicting the expanding step (S35). The expanding apparatus 70 includes a drum 72 that has a diameter larger than the diameter of the wafer 11 and has a circular cylindrical shape. Plural rollers 74 are disposed at the top part of this drum 72 along the circumferential direction. The frame unit 29 is placed on the drum 72 in such a form that a back surface 19b of the protective member 19 located on the opposite side to the semiconductor devices 21 is in contact with the rollers 74.

Furthermore, the expanding apparatus 70 has an inside ring 76 that is disposed on the side of the back surface 19b of the protective member 19 and is made of a metal with a circular ring shape. The lower end part of the inside ring 76 is supported in such a manner that the radial direction thereof is horizontal, and the inside ring 76 is configured in such a manner that the upper end part thereof gets contact with the back surface 19b of the protective member 19. The expanding apparatus 70 further has an outside ring 78 that is disposed on the side of the semiconductor devices 21 with respect to the protective member 19 (i.e. side of a front surface 19a) and is made of a metal with a circular ring shape whose inner diameter is larger than the outer diameter of the inside ring 76. The outside ring 78 is configured in such a manner that the lower end part thereof gets contact with the front surface 19a of the protective member 19 and the upper end part thereof is pressed. The inside ring 76 and the outside ring 78 each having the circular ring shape are coaxially disposed and are configured relatively movably in such a direction as to come closer to each other. Moreover, the difference between the outer diameter of the inside ring 76 and the inner diameter of the outside ring 78 is smaller than the thickness of the protective member 19. When the inside ring 76 and the outside ring 78 relatively move and have come to the same height position, the protective member 19 is clamped and fixed between the outer circumference of the inside ring 76 and the inner circumference of the outside ring 78.

The expanding apparatus 70 further includes a frame holding unit (not depicted). The frame holding unit includes a frame support pedestal (not depicted) disposed to surround the upper end part of the drum 72 from the outer circumferential side. The frame support pedestal has an opening with a diameter larger than the diameter of the drum 72 and is disposed at the same height as the upper end part of the drum 72. Furthermore, clamps (not depicted) are disposed at plural places on the outer circumferential side of the frame support pedestal. When the frame unit 29 is placed on the drum 72 in such a manner that the frame 25 is disposed on the frame support pedestal and the frame 25 is fixed by the clamps, the frame unit 29 is fixed by the frame support pedestal. The frame support pedestal is supported by plural rods (not depicted) that extend along the vertical direction. At the lower end part of each rod, an air cylinder (not depicted) that is supported by a base (not depicted) with a circular disc shape and raises and lowers the rod is disposed.

When each air cylinder is set to the drawn-in state, the frame support pedestal is lowered relative to the drum 72.

In the expanding step (S35), first, the air cylinders are actuated to adjust the height of the frame support pedestal in such a manner that the height of the upper end of the drum 72 corresponds with the height of the upper surface of the frame support pedestal. Next, the frame unit 29 is placed on the drum 72 and the frame support pedestal. Thereafter, the frame 25 is fixed on the frame support pedestal by the clamps. Next, the air cylinders are actuated to lower the frame support pedestal of the frame holding unit relative to the drum 72. Thereby, the protective member 19 is expanded in the radial direction as depicted in FIG. 17A.

When the protective member 19 is expanded in the radial direction, the interval between the semiconductor devices 21 supported by the protective member 19 is widened. Due to this, the metal is deposited on the semiconductor devices 21 more readily in the subsequent metal film covering step (S40) compared with the case in which the expanding step (S35) is not carried out. More specifically, the metal is deposited more readily on the side surfaces 11*f* of the semiconductor devices 21 (i.e. side surfaces of the semiconductor substrate 11*c* and the functional layer 15*c*) and the upper surfaces of the step parts 59*b* (see FIG. 10C, the upper surfaces of the step parts 59*b* are oriented downward in FIG. 17A).

After the protective member 19 is expanded, the inside ring 76 and the outside ring 78 are relatively moved to be brought closer to each other and the protective member 19 is clamped between the outer circumference of the inside ring 76 and the inner circumference of the outside ring 78. Thereby, the protective member 19 is fixed by the inside ring 76 and the outside ring 78 in the expanded state. Thereafter, the protective member 19 is cut into a circular shape at a position between the outside ring 78 and the rollers 74 along the outer circumference of the outside ring 78, so that a ring unit 80 (see FIG. 17B) is formed. With this, the expanding step (S35) is ended.

Figure 17B:
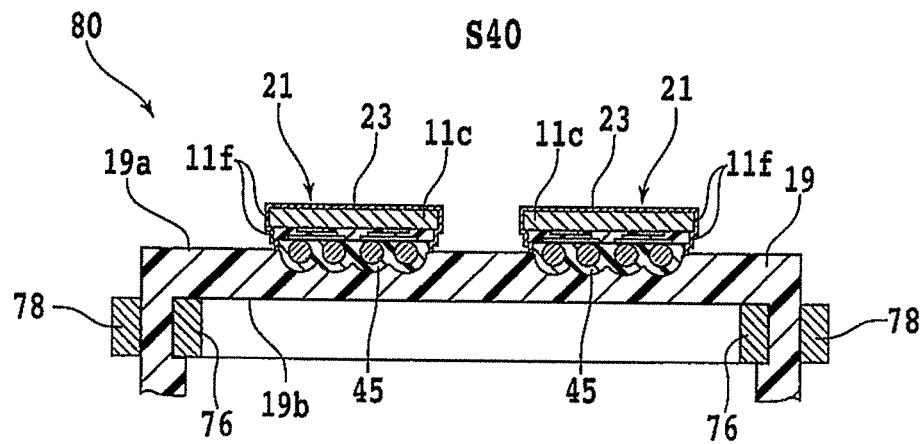
FIG. 17B is a diagram depicting the metal film covering step (S40)
Figure 18:
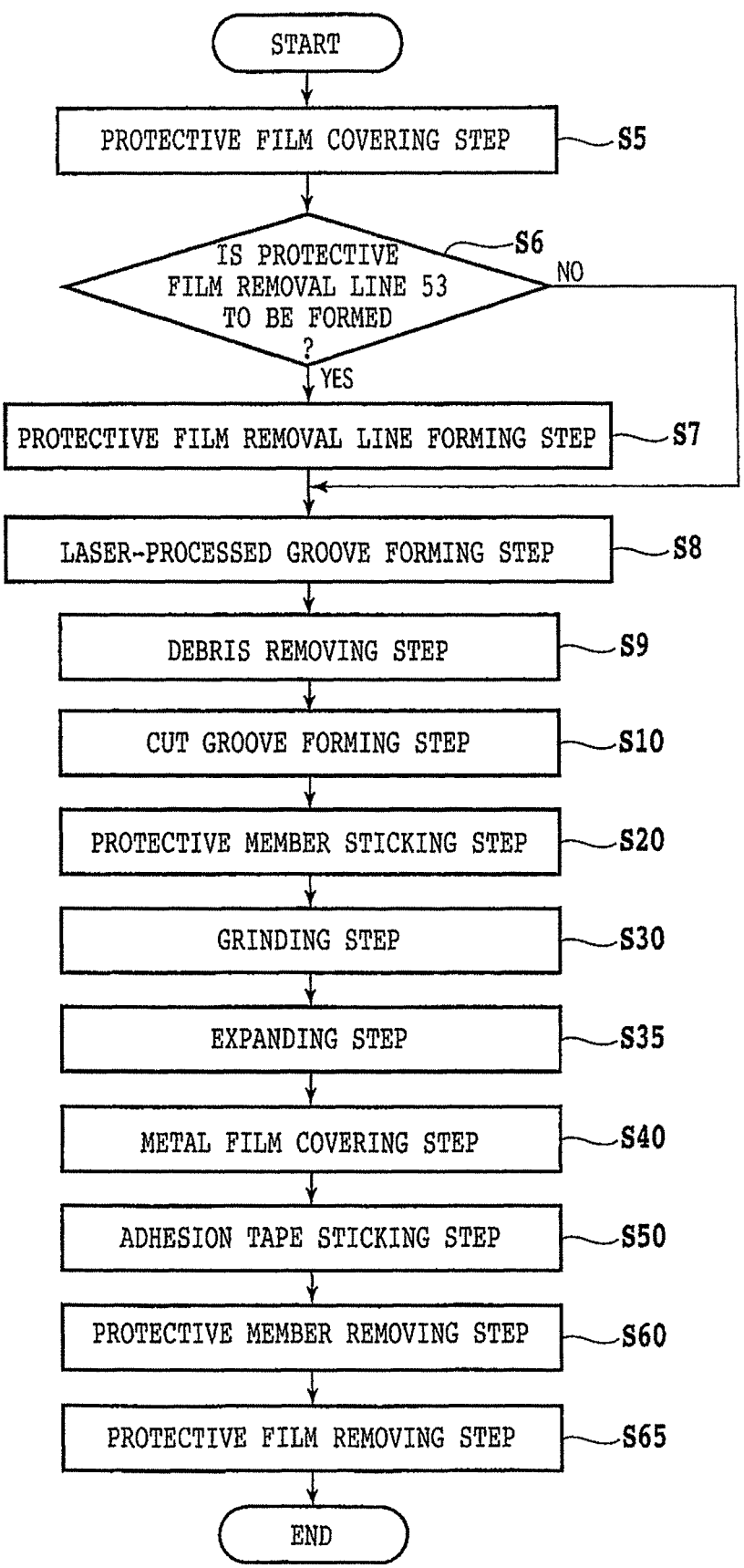
FIG. 18 is a flowchart of a manufacturing method of a semiconductor device with a metal film according to a fourth embodiment.

After the expanding step (S35), the metal film covering step (S40) is carried out by using the above-described sputtering apparatus or the like. In the metal film covering step (S40), the ring unit 80 is disposed on the holding table of the sputtering apparatus in such a manner that the back surface 19*b* of the protective member 19 gets contact with the surface of the holding table, for example. Then, the metal film 23 is formed on the back surfaces 11*e*, the side surfaces 11*f* and so forth of the semiconductor devices 21 by using the sputtering apparatus. FIG. 17B is a diagram depicting the metal film covering step (S40). A flowchart of the manufacturing method of the semiconductor device 21 with the metal film 23 according to the fourth embodiment is depicted in FIG. 18. In the fourth embodiment, the adhesion tape sticking step (S50) and the subsequent steps are sequentially carried out after the metal film covering step (S40) similarly to the third embodiment.

Besides, structures, methods, and so forth according to the above-described embodiments can be carried out with changes as appropriate without departing from the range of the object of the present invention. For example, the expanding step (S35) in the fourth embodiment may be applied to the first and second embodiments. Furthermore, in the first embodiment to the fourth embodiment and the first and second modification examples of the third embodiment, the semiconductor devices 21 with the metal film 23 are manufactured from the workpiece having the semiconductor substrate 11*c* and the functional layer 15*c*. However, if the workpiece is WL-CSP wafer or a resin package board, a semiconductor package device with the metal film 23 may be manufactured from the workpiece.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method of a semiconductor device with a metal film, the manufacturing method comprising:
    a cut groove forming step of causing a cutting blade to cut into a first surface of a workpiece having the first surface under which an electrode of a semiconductor element is disposed in each of regions marked out by a plurality of planned dividing lines disposed in a lattice manner and a second surface on an opposite side to the first surface, and forming cut grooves with a depth that exceeds a finished thickness of the workpiece along the planned dividing lines;
    a protective member sticking step of sticking a protective member to the first surface of the workpiece after the cut groove forming step;
    a grinding step of holding the workpiece on a chuck table through the protective member and grinding a side of the second surface until a thickness of the workpiece becomes the finished thickness to divide the workpiece into a plurality of semiconductor devices;
    a metal film covering step of directly covering, by a metal film, a side surface and a back surface of each of the plurality of semiconductor devices for which the protective member is stuck to a side of the first surface after the grinding step; and
    a protective member removing step of removing the protective member from the side of the first surface after the metal film covering step,
    wherein the manufacturing method further comprises:
        a protective film covering step of covering the side of the first surface by a protective film before the cut groove forming step,
        a protective film removing step of removing the protective film after the protective member removing step,
        wherein the protective member is brought into tight contact with the protective film in the protective member sticking step, and
        a laser-processed groove forming step of irradiating the side of the first surface of the workpiece on which the protective film is formed with a laser beam and forming laser-processed grooves, in the protective film, with a larger width than the cut grooves along the planned dividing lines after the protective film covering step and before the cut groove forming step.

2. The manufacturing method of a semiconductor device with a metal film according to claim 1, the manufacturing method further comprising:
    a debris removing step of carrying out treatment of the workpiece with an etching gas and removing debris adhering to at least one of the laser-processed grooves and the cut grooves after the laser-processed groove forming step or the cut groove forming step, and, before the protective member sticking step.

3. The manufacturing method of a semiconductor device with a metal film according to claim 1, the manufacturing method further comprising:
    an adhesion tape sticking step of sticking an adhesion tape directly to the metal film of the plurality of semiconductor devices after the metal film covering step and before the protective member removing step.

4. The manufacturing method of a semiconductor device with a metal film according to claim 1, wherein the workpiece comprises a semiconductor substrate, and the metal film is in direct contact with the semiconductor substrate.

5. The manufacturing method of a semiconductor device with a metal film according to claim 4, wherein the semiconductor substrate comprises silicon.

6. The manufacturing method of a semiconductor device with a metal film according to claim 4, wherein the semiconductor substrate comprises gallium arsenide.

7. The manufacturing method of a semiconductor device with a metal film according to claim 4, wherein the semiconductor substrate comprises silicon carbide.

8. A manufacturing method of a semiconductor device with a metal film, the manufacturing method comprising:
 a cut groove forming step of causing a cutting blade to cut into a first surface of a workpiece having the first surface under which an electrode of a semiconductor element is disposed in each of regions marked out by a plurality of planned dividing lines disposed in a lattice manner and a second surface on an opposite side to the first surface, and forming cut grooves with a depth that exceeds a finished thickness of the workpiece along the planned dividing lines;
 a protective member sticking step of sticking a protective member to the first surface of the workpiece after the cut groove forming step;
 a grinding step of holding the workpiece on a chuck table through the protective member and grinding a side of the second surface until a thickness of the workpiece becomes the finished thickness to divide the workpiece into a plurality of semiconductor devices;
 a metal film covering step of directly covering, by a metal film, a side surface and a back surface of each of the plurality of semiconductor devices for which the protective member is stuck to a side of the first surface after the grinding step; and
 a protective member removing step of removing the protective member from the side of the first surface after the metal film covering step,
 wherein the manufacturing method further comprises:
  a protective film covering step of covering the side of the first surface by a protective film before the cut groove forming step,
  a protective film removing step of removing the protective film after the protective member removing step,
 wherein the protective member is brought into tight contact with the protective film in the protective member sticking step,
 a laser-processed groove forming step of irradiating the side of the first surface of the workpiece on which the protective film is formed with a laser beam and forming laser-processed grooves with a larger width than the cut grooves along the planned dividing lines after the protective film covering step and before the cut groove forming step, and
 a protective film removal line forming step of forming protective film removal lines obtained through removal of the protective film with a larger width than both the cut grooves and the laser-processed grooves along the planned dividing lines by irradiating the protective film with a laser beam with a wavelength having absorbability with respect to the protective film along the planned dividing lines after the protective film covering step and before the laser-processed groove forming step.

9. The manufacturing method of a semiconductor device with a metal film according to claim 8, wherein the semiconductor substrate comprises silicon.

10. The manufacturing method of a semiconductor device with a metal film according to claim 9, wherein the workpiece comprises a semiconductor substrate, and the metal film is in direct contact with the semiconductor substrate.

11. The manufacturing method of a semiconductor device with a metal film according to claim 10, wherein the semiconductor substrate comprises silicon.

12. The manufacturing method of a semiconductor device with a metal film according to claim 10, wherein the semiconductor substrate comprises gallium arsenide.

13. The manufacturing method of a semiconductor device with a metal film according to claim 10, wherein the semiconductor substrate comprises silicon carbide.

\* \* \* \* \*

UNITED STATES PATENT AND TRADEMARK OFFICE
CERTIFICATE OF CORRECTION

PATENT NO. : 11,164,783 B2
APPLICATION NO. : 16/671463
DATED : November 2, 2021
INVENTOR(S) : Katsuhiko Suzuki It is certified that error appears in the above-identified patent and that said Letters Patent is hereby corrected as shown below:

In the Claims

Column 24, Claim 9, Line 24, delete:
"The manufacturing method of a semiconductor device with a metal film according to claim 8, wherein the semi-conductor substrate comprises silicon."

Insert:
--A manufacturing method of a semiconductor device with a metal film, the manufacturing method comprising:
    a cut groove forming step of causing a cutting blade to cut into a first surface of a workpiece having the first surface under which an electrode of a semiconductor element is disposed in each of regions marked out by a plurality of planned dividing lines disposed in a lattice manner and a second surface on an opposite side to the first surface, and forming cut grooves with a depth that exceeds a finished thickness of the workpiece along the planned dividing lines;
    a protective member sticking step of sticking a protective member to the first surface of the workpiece after the cut groove forming step, the protective member being an adhesion tape having expandability;
    a grinding step of holding the workpiece on a chuck table through the protective member and grinding a side of the second surface until a thickness of the workpiece becomes the finished thickness to divide the workpiece into a plurality of semiconductor devices;
    an expanding step of expanding the protective member and widening an interval between the individual semiconductor devices after the grinding step;
    a metal film covering step of covering, by a metal film, a side surface of each of the plurality of semiconductor devices for which the protective member is stuck to a side of the first surface after the expanding step; and
    a protective member removing step of removing the protective member from the side of the first surface after the metal film covering step.--

Signed and Sealed this
Thirtieth Day of May, 2023

Katherine Kelly Vidal
*Director of the United States Patent and Trademark Office*